United States Patent
Iio et al.

[19]

[11] Patent Number: 6,130,482
[45] Date of Patent: *Oct. 10, 2000

[54] SEMICONDUCTOR DEVICE AND METHOD FOR FABRICATING THE SAME

[75] Inventors: Hiroki Iio; Koichi Hashimoto; Wataru Futo, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/721,637

[22] Filed: Sep. 26, 1996

[30] Foreign Application Priority Data

Sep. 26, 1995 [JP] Japan ................................. 7-247548

[51] Int. Cl.[7] .......................... H01L 29/34; H01L 21/44
[52] U.S. Cl. ..................... 257/774; 257/763; 257/758; 257/775
[58] Field of Search ................................ 257/774, 763, 257/758, 775

[56] References Cited

U.S. PATENT DOCUMENTS

| | | | |
|---|---|---|---|
| 4,230,523 | 10/1980 | Gajda ........................ | 156/657 |
| 4,561,172 | 12/1985 | Slawinski et al. .................. | 29/576 |
| 4,640,738 | 2/1987 | Fredericks et al. .................... | 257/774 |
| 5,117,273 | 5/1992 | Stark et al. .............. | 257/773 |
| 5,317,193 | 5/1994 | Watanabe ................. | 257/774 |
| 5,464,794 | 11/1995 | Lur et al. ................. | 257/774 |

FOREIGN PATENT DOCUMENTS

| | | | |
|---|---|---|---|
| 61-247073 | 11/1986 | Japan . | |
| 1-286442 | 11/1989 | Japan . | |
| 406013380A | 1/1994 | Japan ..................... | 257/751 |
| 406089941A | 3/1994 | Japan ..................... | 257/763 |

*Primary Examiner*—Leo P. Picard
*Assistant Examiner*—Hung Van Duong
*Attorney, Agent, or Firm*—Armstrong, Westerman, Hattori, McLeland and Naughton

[57] ABSTRACT

The present invention relates to a metallization technique of a semiconductor device, more specifically to a semiconductor device having a wiring or plug of a suitable structure for high integration and a method for fabrication of the semiconductor device. The semiconductor device comprises a base substrate 10; an inter-layer insulation film 20 including a first insulation film 16 formed on the base substrate and a second insulation film 18 formed on the base substrate, and having a contact hole 22 which reaches the base substrate 10; and a conducting film 24 formed on an inside wall and a bottom of the contact hole 22, a width of the contact hole in the first insulation film 16 being larger than a width of the contact hole 22 in the second insulation film 18. The conducting film 24 on the inside wall of the contact hole 22, and the conducting film 24 on the bottom of the contact hole 22 is uninterrupted on a boundary.

19 Claims, 39 Drawing Sheets

SEMICONDUCTOR DEVICE AND METHOD FOR FABRICATING THE SAME

BACKGROUND OF THE INVENTION

The present invention relates to a metallization technique of a semiconductor device, more specifically to a semiconductor device having a wiring or plug of a suitable structure for high integration and a method for fabrication of the semiconductor device.

As LSIs increase their scales, further micronization of the devices is sought. To realize semiconductor integrated circuits having gates, wirings and contact holes of more micronized dimensions, photolithography resolutions have been improved conventionally by making exposure wavelengths shorter.

While the minimum resolution dimensions are thus made smaller, device structures which permit alignment margins between lithography steps to be smaller have been studied, and an attempt has been made to reduce device dimensions without reducing dimensions of patterns to be formed therein. Such device structures are exemplified by self-aligned contact (herein after called SAC), borderless contact (herein after called BLC), and so forth.

The conventional SAC will be explained in comparison with a structure which does not use SAC.

In the structure as shown in FIG. 30A in which two gate electrodes 40 are formed on a semiconductor substrate 10, and an inter-layer insulation film 20 is also formed. In opening a contact hole 22 between the two gate electrodes 40 down to the semiconductor substrate 10, it is necessary to position the gate electrodes 40, considering beforehand the alignment precision for opening the contact hole 22.

That is, an interval a between the contact hole 22 and the gate electrodes 40 must be secured to be at least above the alignment precision so that when a conducting film is buried into the contact hole 22, the conducting film and the gate electrodes 40 are not short-circuited (FIG. 30B). Thus, the interval between the gate electrodes 40 is dependent on the contact hole 22, which makes further micronization impossible.

In SAC as shown in FIG. 30C, gate electrodes 40 are covered with an inter-layer insulating film 20 and an etching selective insulating film 38. This keeps the insulating film 38 from being etched when the inter-layer insulating film 20 is etched, and when a conducting film is buried in a contact hole 22, no short-circuit takes place between the conducting film and the gate electrodes.

Accordingly, when a misalignment takes place in a lithography step for forming the contact hole 22, the opening of the semiconductor substrate 10 is determined only by the gate electrodes 40 and the insulating film 38, which enables the gate electrodes 40 and the contact hole 22 to be arranged without considering alignment as shown in FIG. 30D. This makes micronization of devices possible.

Examples of SAC are disclosed in Japanese Patent Laid-Open Publication No. 292323/1986, Japanese Patent Laid-Open Publication No. 106929/1992 and '94 Symp. VLSI Tech., Tech. Dig., pp. 99–100.

Next, the conventional BLC will be explained in comparison with a structure which does not use BLC.

In the structure as shown in FIG. 31A in which a device isolation film 12 is formed on a semiconductor substrate 10, and an inter-layer insulation film 20 is formed, in opening a contact hole 22 near the device isolation film 12, the contact hole 22 and the device isolation film 12 must be spaced from each other so that the contact hole 22 is not positioned on the device isolation film 12 even when misalignment takes place.

That is, when the contact hole 22 is positioned on the device isolation film, the device isolation film 12 is adversely etched in opening the contact hole 22, and when a conducting film 24 is buried in the contact hole 22, a junction short circuit takes place between the conducting film 24 and the semiconductor substrate 10 (FIG. 31B).

In contrast to this, in the BLC as shown in FIG. 31C, an inter-layer insulation film 20 is formed of insulation films 16, 18 having etching selectivity different from each other. By forming the insulation film 16 in contact with the device isolation film 12 of a material having sufficient etching selectivity with respect to the device isolation film 12, the device isolation film 12 is not etched when a contact hole 22 is opened to expose the surface of the semiconductor substrate 10. A junction short circuit between the conducting film buried in the contact hole 22 and the semiconductor substrate 10 can be prevented.

Thus, in the BLC, even when the device isolation film 12 and the contact hole are overlapped, a junction short circuit can be prevented, and it is not necessary to consider an allowance for alignment between the device isolation film 12 and the contact hole 22. The contact hole 22 can be positioned as exemplified in FIG. 31D. This makes device micronization possible.

Semiconductor devices having the above-described conventional BLC, however, have the following problems.

In etching the insulation film 16, it is preferred that wet etching is used to allow a good selectivity between the insulation film 16 and the device isolation film 12, but because wet etching is isotropic and adversely etches the insulation film 15 below the isolation film 18, a cavity is adversely formed. (FIG. 32A). The thus, formed cavity 30 cannot be covered by conventional sputtering and remains even after the conducting film 24 is deposited (FIG. 32B). When a plug 26 is formed in the next step of forming a contact, made by burying tungsten (W), then $WF_6$, which is a source gas for tungsten, intrudes through the cavity 30 to cause substrate erosion called a worm hole. Junction spiking adversely occurs within a source/drain diffused layer 14 (FIG. 32C).

In addition, when using Al (aluminum) deposited by CVD as wiring material, in place of the above-described W plug, the Al and the semiconductor substrate directly contact each other in the cavity 30, and the Al and the semiconductor substrate react with each other by means of heat treatments in later steps, with a result that junction spiking takes place in the source/drain diffused layer 14 (FIG. 33A).

In addition, the above is true for a case in which Cu is used as a wiring material. Cu especially forms a deep energy level in the forbidden band when it is diffused in the semiconductor substrate which result much degrades the characteristics of the transistors. In addition, Cu is apt to diffuse in the silicon oxide film, and if the Cu reaches the gate oxide film 34, the Cu may add to leak current between the gate electrode 40 and the semiconductor substrate 10 (FIG. 33B).

In addition, in a semiconductor device shown in FIG. 34, which includes a contact plug 206 buried in an inter-layer insulation film 202 on a semiconductor substrate 200, it is often a case that when the BLC structure is used in opening a via-hole for connection to a wiring layer 210, an insulation film 220 is etched immediately onto the inter-layer insulation film 202 due to misalignment in opening the via-hole, etc., and a contact plug 208 is exposed in a cavity 224 formed when etching the etching stopper film 216, with a result that a contact plug 230 short-circuits with the contact plug 208.

In addition, when an etching stopper film 112 is removed without forming a cavity 124 using an anisotropic reactive ion etching, it is difficult to secure selectivity with respect to a ground film.

That is, in the structure of FIG. 35A, when the etching stopper film 112 in a wiring groove 118 is etched under conditions which secure a sufficient selectivity with respect to an inter-layer insulation film 104, a sufficient selectivity with respect to a contact plug 110, and the contact plug 110 is sometimes etched (FIG. 35B).

Opposite to this, when the etching stopper film 112 is etched under conditions which secure a sufficient etching ration with respect to the contact plug 110, a sufficient selectivity with respect to the inter-layer insulation film 104, and the inter-layer insulation film 104 is sometimes etched (FIG. 35C).

Thus, in etching the etching stopper film 112, it is difficult to concurrently secure etching selectivity with respect to both the contact plug 110 and the inter-layer insulation film 104. Contact characteristics are degraded, which affects reliability of the semiconductor device.

In addition, when the BLC structure is used in forming a contact plug 144 on a wiring layer 122 buried in an inter-layer insulation film 114, the wiring layer 122 is exposed in a cavity 138 formed by retreating an etching stopper film 130. When a plug 142 is buried, a raw material gas of the plug 142 reacts with the wiring layer 122 to form a high-resistance reaction product 146, which sometimes deteriorates contact characteristics between the contact plug 144 and the wiring 122 (FIG. 36).

The inventors have found a new problem which had not been discovered, in studying semiconductor devices of the above-described conventional structures.

That is, in the SAC as exemplified in FIG. 37A in which a gate electrode 40 and a contact hole 22 overlap each other, and a step is formed in the contact hole, it has been found that when the contact hole 22 is opened in an inter-layer insulation film 20 formed of an insulation film 18 and an insulation film 16 which are formed of SiN film, the SiN film is more worn at the shoulder of the step in etching the insulation film 18. As a result, when the worn SiN film is removed using the conventional technique, even an insulation film 38 directly below the SiN film is adversely etched as shown in FIG. 37A by the dotted line, and a gate electrode 40 is adversely exposed.

When phosphoric acid and fluorine radicals are used in the etching to thereby raise etching selectivity between the SiN film and the oxide film to suppress the above-described wearing of the oxide film, as shown in FIG. 37B, the etching horizontally advances in the insulation film 16, and a cavity 30 is adversely formed. Subsequently when a conducting film 24 is deposited, the conduction film 24 is not deposited in the cavity 30. In the next step of forming a contact by burying W, $WF_6$ intrudes through the cavity 30 to cause substrate erosion called a worm hole. Junction breakdown adversely takes place near a source/drain diffused layer 14.

Also in the case in which a self-aligned silicide (salicide) is formed on the source/drain diffused layer 14, a semiconductor substrate 10 is not sufficiently covered with the silicide layer 44 at the edge of the device isolation film 12, and a worm hole is caused at the edge which results in junction breakdown (FIG. 38).

SUMMARY OF THE INVENTION

An object of the present invention is to provide a semiconductor device with SAC or BLC which is free from junction leaks and short circuits between the wirings, and to provide a method for fabrication of the semiconductor device.

The above-described object is achieved by a semiconductor device comprising: a base substrate; an inter-layer insulation film including a first insulation film formed on the base substrate and a second insulation film formed on the first insulation film, and having an opening which reaches the base substrate; and a conducting film formed on an inside wall and a bottom of the opening; a width of the opening in the first insulation film being larger than a width of the opening in the second insulation film, and the conducting film on the inside wall of the opening, and the conducting film on the bottom of the opening being uninterrupted at a boundary between the inside wall and the bottom of the opening. In the semiconductor device having such constitution, erosion of the base substrate can be prevented by source gases in burying the plug in the opening.

In the above-described semiconductor device, it is preferred that the conducting film is buried in the opening in the first insulation film below the second insulation film.

The above-described object is also achieved by a semiconductor device comprising: a base substrate; an inter-layer insulation film formed on the base substrate, and an opening formed therein, the opening having different sizes of widths according to depth; and a conducting film formed on an inside wall and a bottom of the opening; a width of the bottom of the opening being substantially the same as a minimum width of the opening, and a portion of the base substrate on the bottom of the opening being covered by the conducting film.

In the above-described semiconductor device, it is preferred that the inter-layer insulation film comprises a first insulation film formed on the base substrate, a second insulation film formed on the first insulation film, and a third insulation film formed on the second insulation film; a width of the opening in the second insulation film is larger than a width of the opening in the third insulation film; and a width of the opening in the first insulation film is substantially the same as a width of the opening in the third insulation film. In the semiconductor device having such constitution, a BLC can be formed without erosion of the base substrate.

In the above-described semiconductor device, it is preferred that the base substrate further comprises one wiring layer. The semiconductor device according to the present invention is applicable to any one of a plurality of wiring layers of a multi-layer wiring structure.

The above-described object is also achieved by a method for fabricating a semiconductor device comprising: a first insulation film depositing step of depositing a first insulation film on a base substrate; a second insulation film depositing step of depositing a second insulation film having etching characteristics different from those of the first insulation film; a first opening forming step of anisotropically etching the second insulation film to open an opening which reaches the first insulation film; a second opening forming step of isotropically etching that portion of the first insulation film in the opening to open the opening down onto the base substrate while etching that portion of the first insulation film below the second insulation film to form a cavity in the first insulation film below the second insulation film; and a conducting film forming step of depositing a conducting film in the opening to close at least an opening of the cavity so that the base substrate is not exposed to the opening. In this method for fabricating a semiconductor device, source gases do not directly contact the base substrate in a later step of burying the plug in the opening, and erosion of the base substrate can be precluded.

In the above-described method for fabricating the semiconductor device, it is preferred that the conducting film is deposited by collimated sputtering method in the conducting film depositing step. The conducting film is deposited by collimated sputtering, whereby an opening of the cavity can be easily closed.

In the above-described method for fabricating the semiconductor device, it is preferred that in the conducting film depositing step the conducting film is deposited so that a thickness of the conducting film on the bottom of the opening is larger than that of the first insulation film. An opening of the cavity can be easily closed.

In the above-described method for fabricating the semiconductor device, it is preferred that the conducting film is deposited by a CVD method in the conducting film depositing step. The conducting film is deposited by CVD, whereby the conducting film can be easily buried in the cavity.

In the above-described method for fabricating the semiconductor device, it is preferred that in the conducting film depositing step a thickness of the conducting film on the bottom of the opening is greater than half of a thickness of the first insulation film, whereby the opening of the cavity can be easily filled.

In the above-described method for fabricating the semiconductor device, it is preferred that in the conducting film depositing step a thickness of the conducting film on the bottom of the opening is above a half of a thickness of the first insulation film. The conducting film can be easily buried in the cavity.

The above-described object is also achieved by a method for fabricating a semiconductor device comprising: a first insulation film depositing step of depositing a first insulation film on a base substrate; a second insulation film depositing step of depositing a second insulation film on the first insulation film, the second insulation film having etching characteristics different from those of the first insulation film; a third insulation film depositing step of depositing a third insulation film on the second insulation film, the third insulation film having etching characteristics different from those of the second insulation film; a first opening forming step of anisotropically etching the third insulation film to open an opening which reaches the second insulation film; the second opening forming step of removing that portion of the second insulation film in the opening by a technique which etches the second insulation film horizontally as well as to open the opening down onto the first insulation film; a third opening forming step of anisotropically etching that portion of the first insulation film in the opening to open the opening down onto the base substrate; and a conducting film forming step of depositing a conducting film so as to cover at least that portion of the base substrate exposed in the opening. In this method for fabricating a semiconductor device, even when the second insulation film must be isotropically etched to use the SAC, erosion of the base substrate by source gases in forming the plug can be prevented.

In the above-described method for fabricating the semiconductor device, it is preferred that in the third opening forming step, an overetching amount in etching the first insulation film is set below about 50%.

In the above-described method for fabricating a semiconductor device, the base substrate further comprises at least one wiring layer, whereby the semiconductor device according to the present invention is applicable to any one of a plurality of wiring layers of a multi-layer wiring structure.

The above-described objects are achieved by the method for fabricating a semiconductor device comprising: a first insulation film depositing step of depositing a first insulation film on a base substrate; a second insulation film depositing step of depositing, on the first insulation film, a second insulation film which is thicker than the first insulation film and has etching characteristics different from those of the first insulation film; a third insulation film depositing step of depositing, on the second insulation film, a third insulation film which is thicker than the second insulation film and has etching characteristics different from those of the second insulation film; a first opening forming step of etching the third insulation film using the second insulation film as a stopper to form an opening which reaches the second insulation film; a second opening forming step of etching the second insulation film in the opening using the first insulation film as a stopper to extend the opening onto the first insulation film; and a third opening forming step of etching the first insulation film in the opening to extend the opening down to the base substrate. A semiconductor device is thus fabricated, whereby the opening can be formed while the base substrate is less affected.

BRIEF DESCRIPTION OF THE DRAWINGS

FIGS. 8A–8D are explanatory views of the buried wiring to which a BLC structure is applied to.

DETAILED DESCRIPTION OF THE INVENTION

A First Embodiment

The semiconductor device according to a first embodiment of the present invention and a method for fabricating the semiconductor device will be explained with reference to FIGS. 1 to 5.

Figure 1:
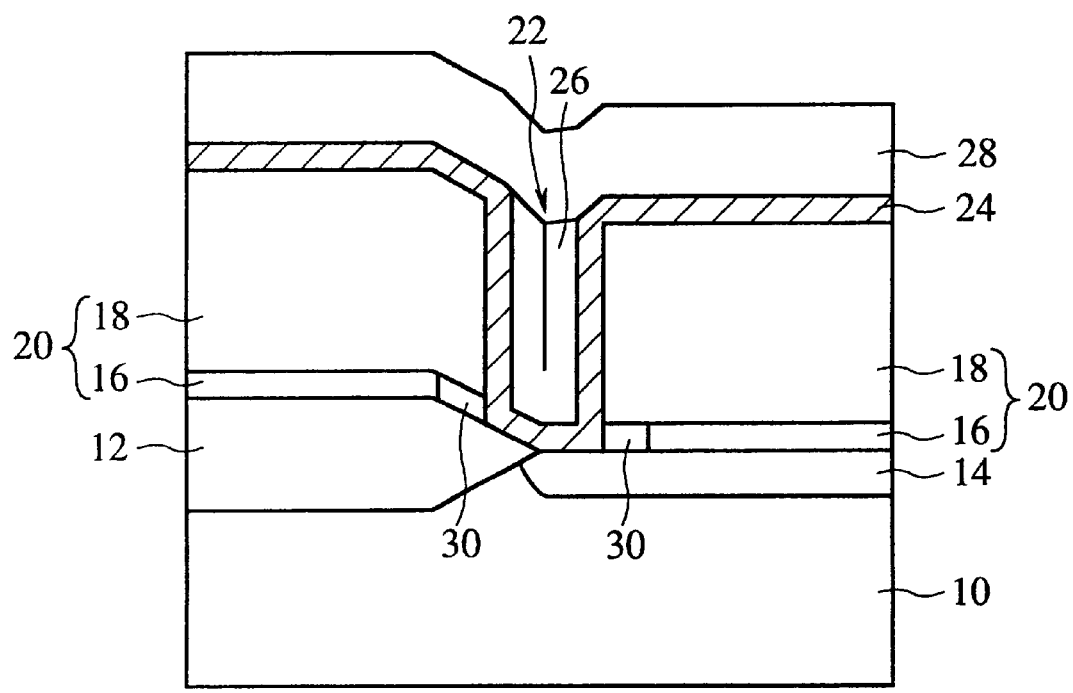
FIG. 1 is a schematic sectional view of the semiconductor device according to a first embodiment of the present invention, which explains a structure thereof.
Figure 4A:
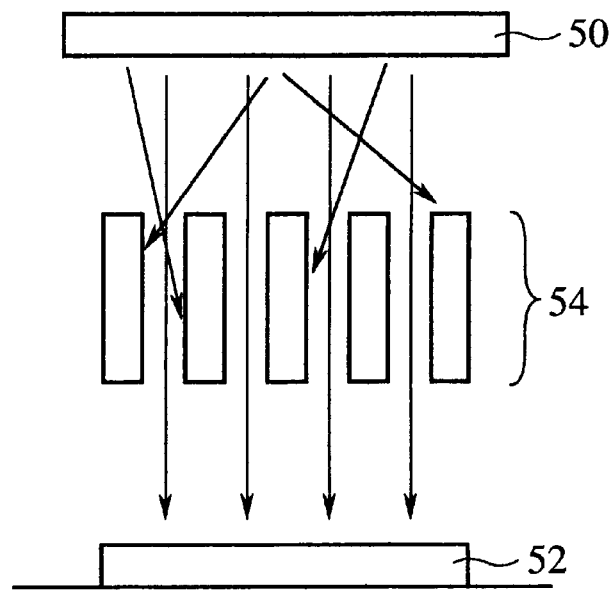
FIGS. 4A–4C are views explaining the principle of collimated sputtering.
Figure 4B:
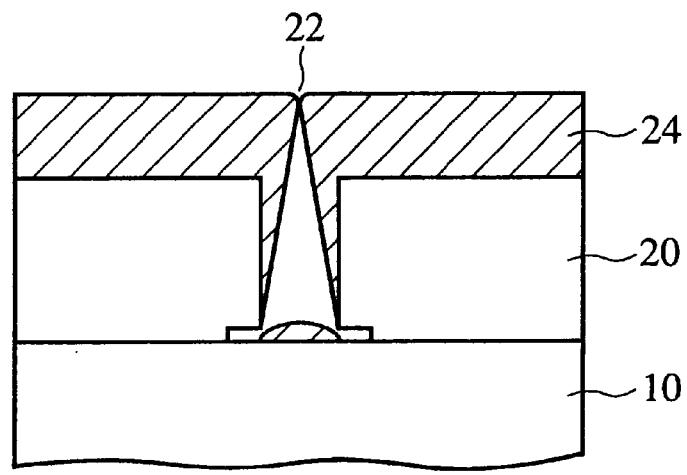
Figure 4C:
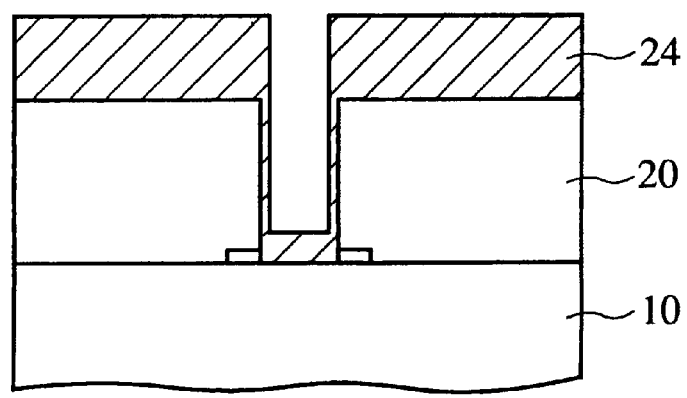
Figure 5:
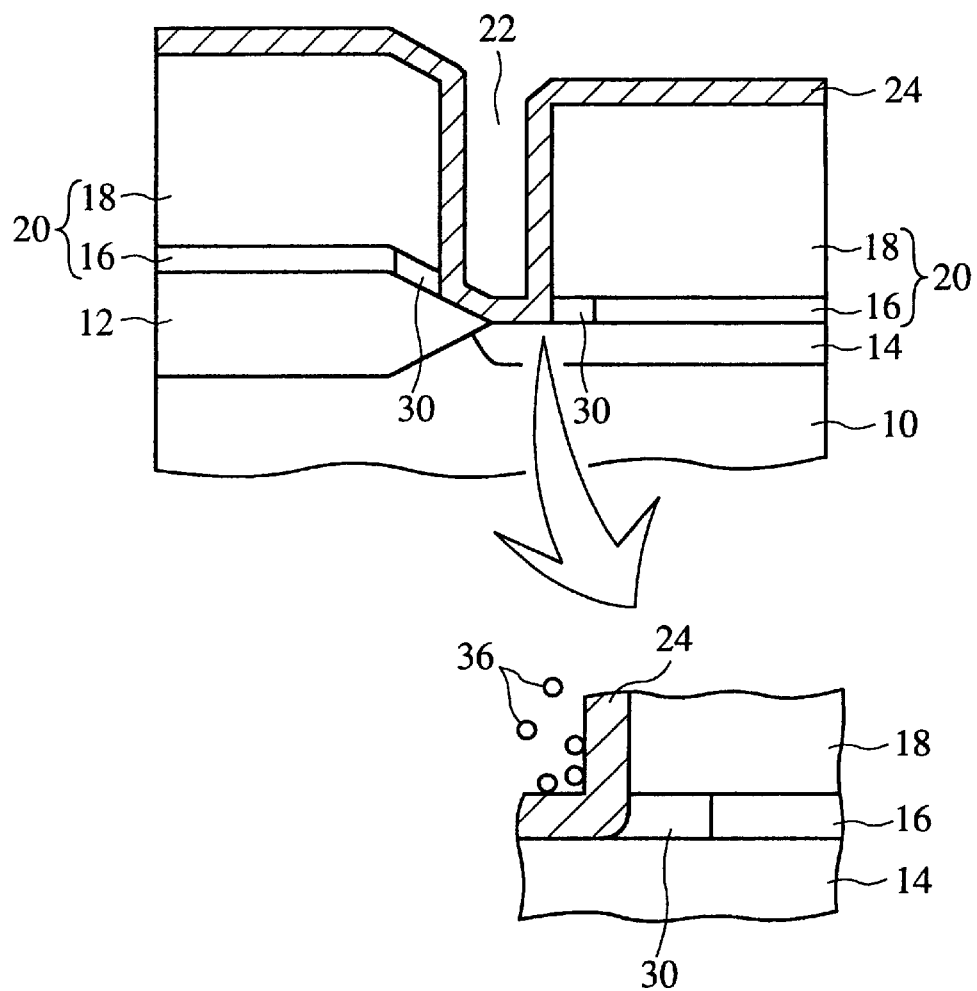
FIG. 5 is a view explaining the effect of the method for fabricating the semiconductor device according to the first embodiment of the present invention.

FIG. 1 is a schematic sectional view of the semiconductor device according to the present embodiment explaining a structure thereof. FIGS. 2A–2D and 3A–3C are sectional views of the semiconductor device according to the present embodiment in the steps of the method for fabricating the same, which explain the method for fabricating the same. FIGS. 4A–4C are views explaining the principle of collimated sputtering. FIG. 5 is a view explaining effects of the method for fabricating the semiconductor device according to the present embodiment.

A structure of the semiconductor device according to the present embodiment will be explained with reference to FIG. 1.

A device isolation film 12 for defining a device region is formed on a semiconductor substrate 10. A diffused layer 14 is formed in the device region. An inter-layer insulation film 20 formed of an etching stopper film 16 and an insulation film 18 is formed on the semiconductor substrate 10. A contact hole 22 is opened in the inter-layer insulation film 20, which reaches the semiconductor substrate 10. A conducting film 24 as a barrier metal is formed on the inside walls of the contact hole 22 and on the inter-layer insulation film 20. A plug 26 is buried in the contact hole 22 with the conducting film 24 formed therein. A wiring layer 28 is formed on the inter-layer insulation film 20 and connected to the plug 26.

A characteristic of the semiconductor device according to the present embodiment is that a part of the etching stopper film 16 near the contact hole 22 is horizontally etched, and a cavity 30 is formed. The conducting film 24 formed on the inside of the contact hole 22 is not interrupted near the cavity 30, instead it completely covers the inside of the contact hole.

Then, the method for fabricating the semiconductor device according to the present embodiment will be explained with reference to FIGS. 2A–2D, 3A–3C, 4A–4C and 5.

Figure 2A:
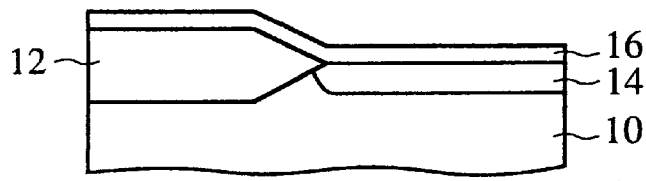
FIGS. 2A–2D are sectional views of the semiconductor device according to the first embodiment of the present invention in the steps of the method for fabricating the same, which explain the method (Part 1).

First, an insulation film to be the etching stopper film 16 is deposited on the semiconductor substrate 10 on which the diffused layer 14 is formed in the device region defined by the device isolation film 12 (FIG. 2A). The etching stopper film is formed of, e.g., SiN film and is deposited by, e.g., plasma CVD at a 400° C. substrate temperature, with a 300 W power, and a 100 cc/min $SiH_4$ flow rate and a 50 cc/min $NH_3$ flow rate.

Figure 2B:
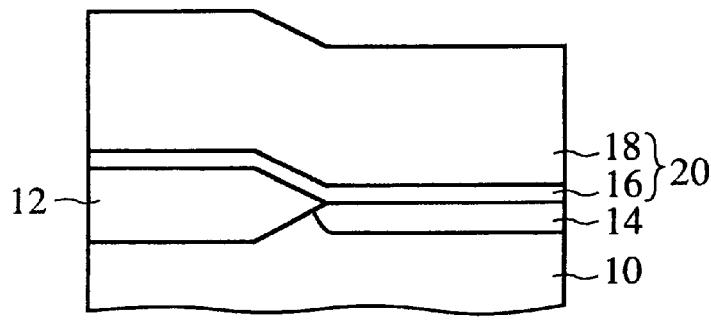

Then, the insulation film 18 is deposited on the etching stopper film 16 to form the inter-layer insulation film 20 (FIG. 2B). The insulation film 18 may be, e.g., $SiO_2$ film, which is deposited by, e.g., plasma CVD at a 400° C. substrate temperature, with a 300 W power, and a 50 cc/min $SiH_4$ flow rate and a 500 cc/min $N_2O$ flow rate.

Figure 2C:
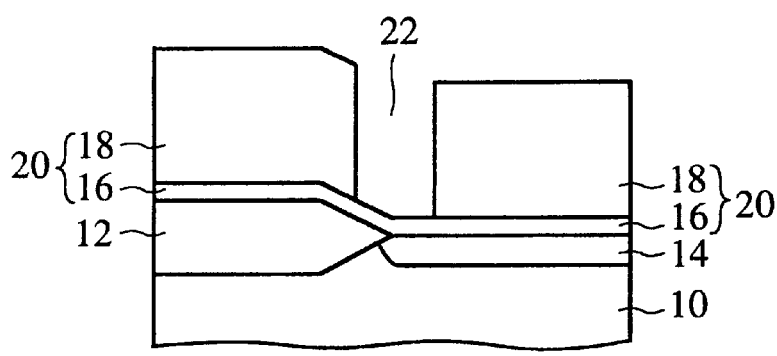

Then, the contact hole 22 is opened by the usual lithography and anisotropic etching methods in the insulation film 18 down to the surface of the etching stopper film 16 (FIG. 2C). At this time, as an etching condition, an etching rate of the SiN film, which is the etching stopper film 16 for the $SiO_2$ film, which is the insulation film 18, is set sufficiently low, so that the etching for the contact hole does not arrive at the semiconductor substrate 10.

Figure 2D:
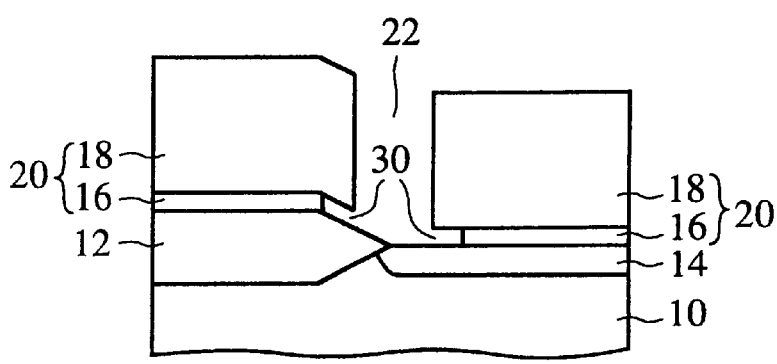

Then, the etching stopper film 16 in the contact hole 22 is removed by isotropic etching (FIG. 2D). By this etching, the bottom of the contact hole 22 arrives at the surface of the semiconductor substrate 10 while a part of the etching stopper film 16 below the insulation film 18 near the contact hole 22 is etched, and a cavity 30 is formed. The isotropic etching is wet etching using a 90% aqueous solution of phosphoric acid conducted at 100° C. This isotropic etching removes only the etching stopper film 16 without affecting the semiconductor substrate 10, the insulation film 18 and the device isolation film 12.

Figure 3A:
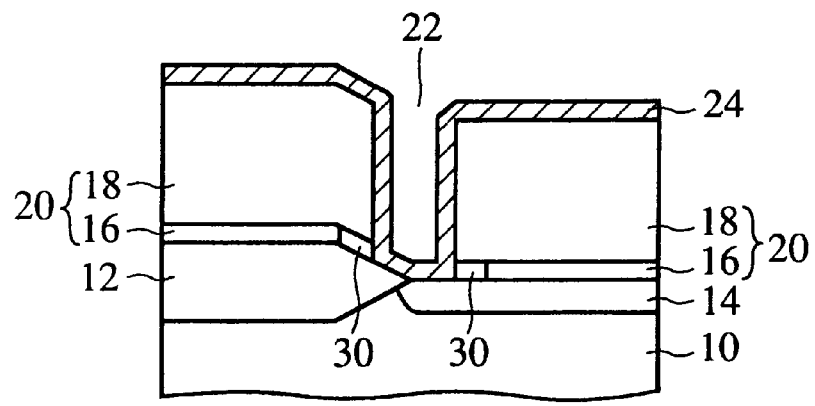
FIGS. 3A–3C are sectional views of the semiconductor device according to the first embodiment of the present invention in the steps of the method for fabricating the same, which explain the method (Part 2).

Next, the conducting film 24 is formed in such a manner as to cover the opening of the cavity 30 (FIG. 3A). In depositing the conducting film 24, collimated sputtering, which can deposit the conducting film 24 thick on the bottom of the contact hole 22 is preferred to the usual sputtering. The conducting film 24 is formed by depositing TiN film, e.g., with a 10 kW power, at a collimator aspect ration of 2, and at a 2 mTorr pressure.

In the collimated sputtering, as shown in FIG. 4A, a collimator 54 is disposed between a target 50 and a substrate 52 to deposit on the substrate 52 sputtered particles having perpendicular components with respect to the substrate 52.

If the conducting film 24 is deposited inside the contact hole of a large aspect ratio by the usual sputtering, in which sputtered particles contain components in various directions, as shown in FIG. 4B, the deposition rate is higher nearer the opening, and it is difficult to deposit the sputtered particles on the bottom.

Many of the sputter particles admitted through the collimator have perpendicular components and can be deposited easily on the bottom of the contact hole 22 (FIG. 4C).

The conducting film 24 is to be a barrier layer for $WF_6$ gas in the later burying step and has the effects of isolating the semiconductor substrate 10 from the contact hole 22 in space, but electrically connecting both to each other.

It is necessary that the conducting film 24 is formed so as to cover at least the opening of the cavity 30, and to this end the conducting film 24 must be formed in a thickness which is at least substantially the same as a height of the opening of the cavity 30. That is, when the opening has a 100 nm-height, the conducting film 24 must be formed with a thickness greater than 100 nm.

Figure 3B:
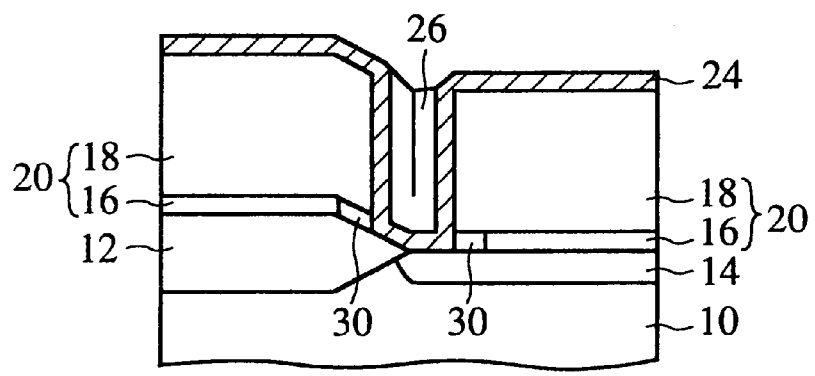

Subsequently, tungsten (W) is buried in the contact hole 22 by blanket W-CVD and is etched back to form the plug 26 (FIG. 3B). A tungsten (W) film is formed, e.g., at a 400° C. substrate temperature, at an 80 Torr pressure, at a 20 cc/min $WF_6$ flow rate and at a 2000 cc/min $H_2$ flow rate, and the etching back is conducted, e.g., at a 100 cc/min $Cl_2$ flow rate, with a 200 W power, and at a 6 mTorr pressure.

To form the W film, $WF_6$ gas, which is very reactive with Si, of which the semiconductor substrate 10 is formed, is used, but the semiconductor substrate 10 is spaced from the contact hole 22 by the conducting film 24. The conducting film 24, which is formed of TiN film, has good barrier properties against erosion by $WF_6$, and $WF_6$ molecules 36 do not arrive at the semiconductor substrate 10 in the cavity 30. Junction breakdown of the source/drain region by erosion can be prevented (FIG. 5).

Figure 3C:
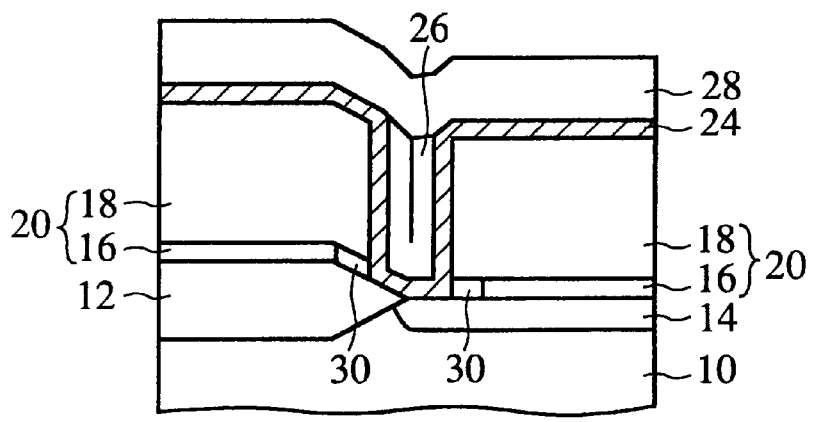

Next, the wiring layer 28 is formed and patterned, and the semiconductor device can be fabricated without junction spiking (FIG. 3C).

As described above, according to the present embodiment, the cavity formed by the isotropic etching of the etching stopper film is isolated in space by deposition of the conducting film, whereby $WF_6$ gas and the semiconductor film do not directly contact each other even in forming the W film, using $WF_6$ gas. Junction spiking due to the erosion by the $WF_6$ gas can be prevented, whereby the semiconductor device can have higher reliability.

The present invention is not limited to the above-described embodiment and covers other variations and modifications.

For example, in the above-described embodiment, the W plug is formed by CVD using $WF_6$ gas, but the present invention is applicable to cases in which the plug 26 is formed of other metal materials, such as Al, Cu, etc.

That is, in the semiconductor device according to the above-described embodiment, the cavity 30 formed by isotropic etching of the etching stopper film 16 is spaced from the interior of the contact hole 22 by the conducting film 24. Accordingly in a case where Al or Cu is used as a material of the plug 26, the conducting film 24 functions as a barrier film for prohibiting direct contact of the silicon substrate in the cavity 30 to the plug material, whereby junction spiking by the reaction between the silicon substrate with the plug material can be prevented.

In using Al as a plug material, blanket Al-CVD and selective aluminum CVD are applicable. In a case that Cu is used as a plug material, Cu is deposited by CVD or sputtering and then is reflowed to bury the Cu in the contact hole 22. Then, the plug 26 is formed by polishing back the Cu.

In the above-described embodiment SiN film is used as the etching stopper film 16, and $SiO_2$ is used as the insulation film 18, but as long as the respective films can be independently etched under set etching conditions, combinations of any insulation films can be used.

As the conducting film 24 TiN film formed by collimated sputtering is used, but a laminated film of TiN film/Ti film may be used. The use of such laminated film makes it possible to reduce contact resistance between the semiconductor substrate 10 and the conducting film 24.

The Ti film can be deposited by CVD or sputtering. To deposit the Ti film by sputtering it is not essential to use collimated sputtering. As long as the cavity 30 can be completely closed by the TiN film deposited on the Ti film, the Ti film may be deposited by the usual sputtering.

The conducting film 24 is formed of TiN film by collimated sputtering but can be any conducting film if the conducting film is a conducting film which is corrosion-resistant to $WF_6$ gas. The conducting film 24 may be W film or others deposited by collimated sputtering.

The conducting film 24 may be formed of a material having the effect of a diffusion barrier to Cu and Al, e.g., WN film, Ta film, TaN film, TiSiN film, WSiN film or others.

An aqueous solution of phosphoric acid is used to etch the SiN film, but other etching methods may be used.

In burying W in the plug 26, blanket W-CVD and etching back technique are used, but W may be buried in the contact hole 22 by selective tungsten CVD.

The above-described conditions are one example, and the values of the conditions may be changed to other suitable values without affecting the effects of the present invention.

A Second Embodiment

The semiconductor device according to a second embodiment of the present invention and the method for fabricating the same will be explained with reference to FIGS. 6 and 7A–7C. The same members of the present embodiment as the semiconductor device according to the first embodiment and the method for fabricating the same are represented by the same reference numerals as those of the first embodiment in order to simplify or omit their explanation.

Figure 6:
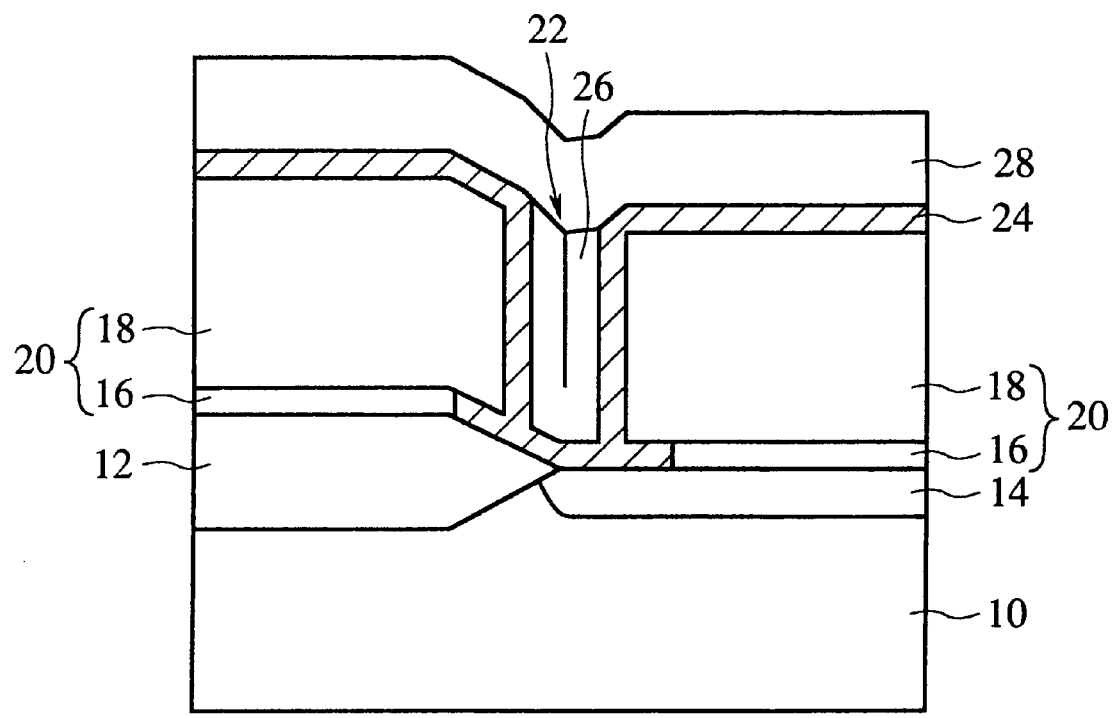
FIG. 6 is a schematic view of the semiconductor device according to a second embodiment of the present invention.
Figure 7A:
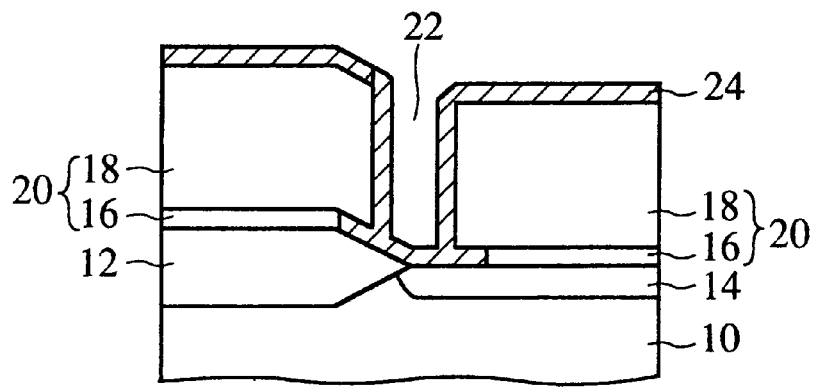
FIGS. 7A–7C are sectional views of the semiconductor device according to the second embodiment of the present invention in the steps of the method for fabricating the same, which explain the method for fabricating the same.
Figure 7B:
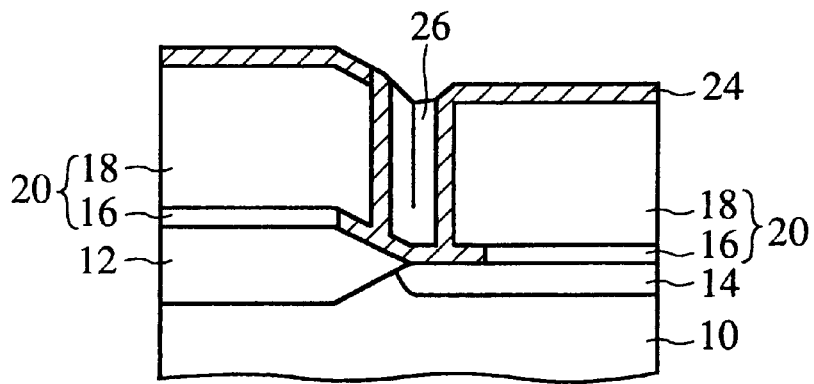
Figure 7C:
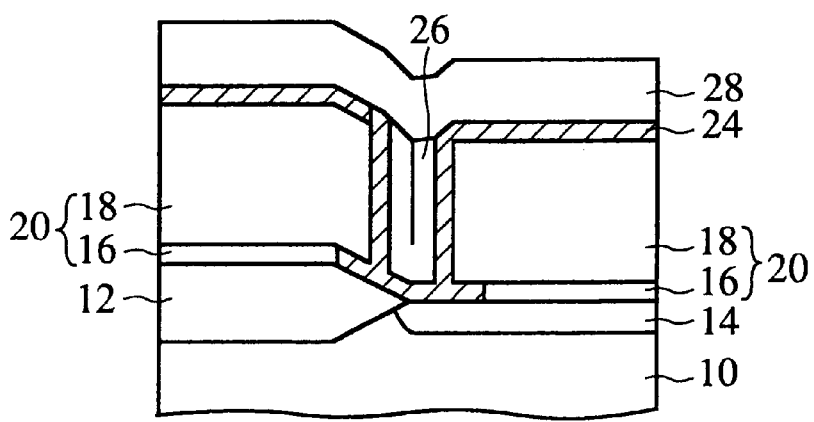

FIG. 6 is a sectional view of the semiconductor device according to the present embodiment explaining a structure thereof, and FIGS. 7A–7C are sectional views of the semiconductor device in the steps of the method for fabricating the same, which explain the method for fabricating the same.

A structure of the semiconductor device according to the present embodiment will be explained with reference to FIG. 6.

The present embodiment is characterized in that a cavity 30 is buried, or filled-in, by the conducting film 24. That is, in the semiconductor device according to the first embodiment shown in FIG. 1, the conducting film 24 is deposited by collimated sputtering to space the interior of the contact hole 22 from the cavity 30, but in the semiconductor device according to the second embodiment the conducting film 24 is buried in the cavity 30 to isolate the interior of the contact hole 22 from the semiconductor substrate 10. The cavity 30 is buried, or filled-in, by the conducting film 24 to isolate the interior of the contact hole 22 from the semiconductor substrate 10.

Thus the erosion in forming a plug is thus prevented.

Next, the method for fabricating the semiconductor device according to the second embodiment will be explained with reference to FIGS. 7A–7C.

The contact hole 22 is opened in an inter-layer insulation film 20 in the same way as in the method for fabricating the semiconductor device according to the first embodiment as shown in FIGS. 2A–2D.

Then, the conducting film 24 is deposited by CVD. The conducting film can be, e.g., TiN film. The conducting film 24 is deposited, e.g., by CVD at a 500° C., at a 10 cc/min $TiCl_4$ flow rate and a 500 cc/min $NH_3$ flow rate and at a 100 mTorr pressure.

As a source gas of Ti, TDMAT (tetrakis dimethylamino titanium), TDEAT (tetrakis diethylamino titanium), $TiI_4$ or others may be used. In a case that TDMAT is used, Ti can be deposited, e.g., at a 400° C. substrate temperature, a 2 cc TDMAT flow rate, a 10 cc $NH_3$ flow rate and a 100 mTorr pressure. In a case that TDEAT is used, Ti can be deposited, e.g., at a 400° C. substrate temperature, a 30 cc TDEAT flow rate, a 10 slm $NH_3$ and Ar mixed gas flow rate and at a 10 Torr pressure.

By CVD, which is superior to sputtering in coverage, and by optimizing film depositing conditions, the interior of the cavity 30 can be easily buried or filled-in. Accordingly, the barrier effect of $WF_5$ gas is so high that the effect of isolating the semiconductor substrate 10 from the contact hole 22 in space but electrically connecting both to each other can be higher than by sputtering.

In forming the conducting film 24 of TiN film by CVD, to sufficiently produce the effects of the present invention, the conducting film 24 must be formed thick enough to close at least the opening of the cavity 30. Although the thickness of the conducting film 24 depends on coverage ability of the CVD film, and cannot be uniquely determined, the conducting film 24 must be formed so as to have a thickness of above about 100 nm when the TiN film is formed on the above-described conditions because the height of the opening is, e.g., 100 nm.

In depositing the conducting film 24 having good step coverage, the conducting film 24 is deposited in a film thickness which is above about a half of a film thickness of the etching stopper film 16 to thereby completely fill the cavity 30.

Then, a plug 26 is formed in the same way as in the method for fabricating the semiconductor device according to the first embodiment (FIG. 7B), and then a wiring layer 28 is formed (FIG. 7C).

Thus, according to the present embodiment, because the conducting film is buried in the cavity formed by isotropically etching the etching stopper film, in forming a W film using $WF_6$ gas, the $WF_6$ gas and the semiconductor substrate do not directly contact each other. Junction spiking due to erosion by $WF_6$ gas can be prevented. Accordingly, the semiconductor device can have higher reliability.

The present invention is not limited to the present embodiment and covers other variations and modifications.

To give an example, the conductor film 24 is a TiN film formed by CVD, but it may be a conducting film which is corrosion-resistant to $WF_6$ gas. The conducting film 24 may be, e.g., impurity-doped polycrystalline silicon film, amorphous silicon film or others as long as the erosion by the $WF_6$ does not reach the semiconductor substrate 10.

As with the first embodiment, the structure of the semiconductor device according to the present embodiment is applicable to the semiconductor device fabrication methods in which Al plugs and Cu plugs are formed.

The above-described processing conditions are one example, and changes in the values of the conditions do not affect the effects of the present invention.

A Third Embodiment

The semiconductor device according to a third embodiment of the present invention and the method for fabricating the same will be explained with reference to FIGS. 8A–8D, 9A–9C, 10A–10B, 11A–11C, and 12A–12B.

Figure 9A:
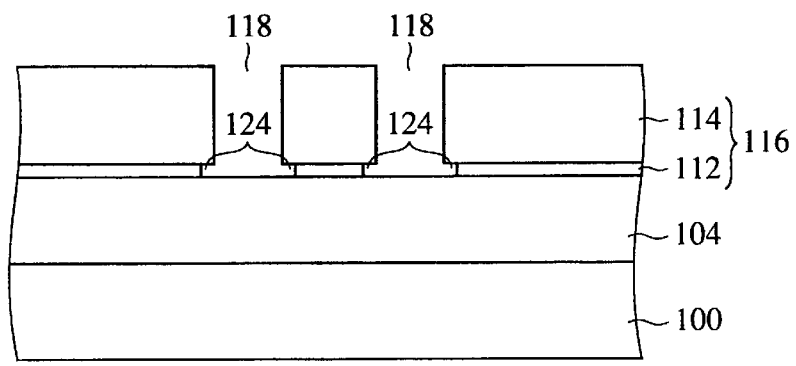
FIGS. 9A–9C are explanatory views of disadvantages of the buried wiring of Cu.
Figure 9B:
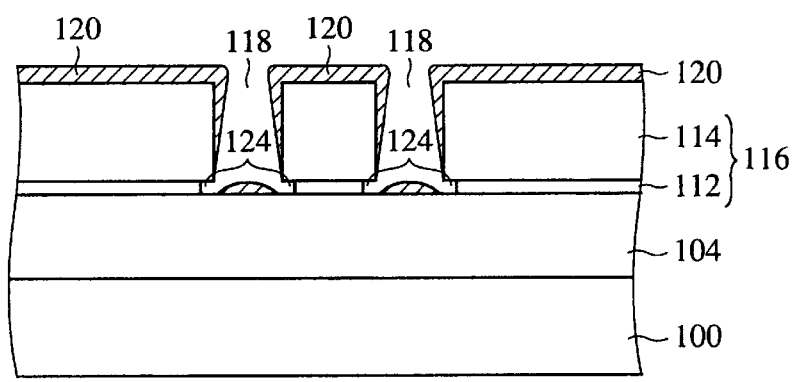
Figure 9C:
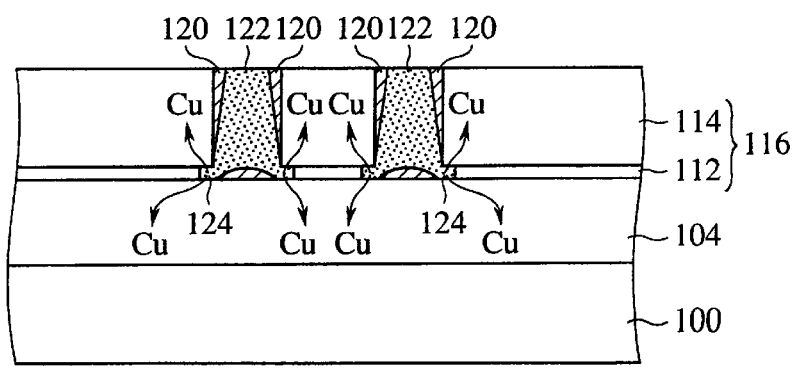
Figure 10A:
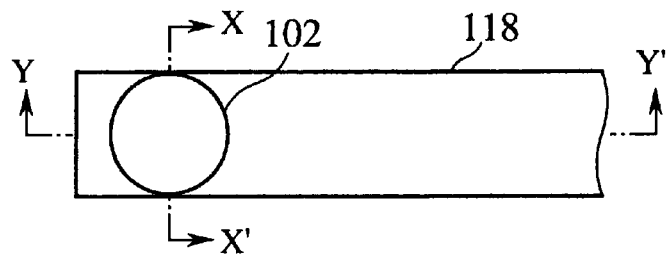
FIG. 10A is a plan view of the semiconductor device according to the third embodiment, which explains a structure thereof.
Figure 10B:
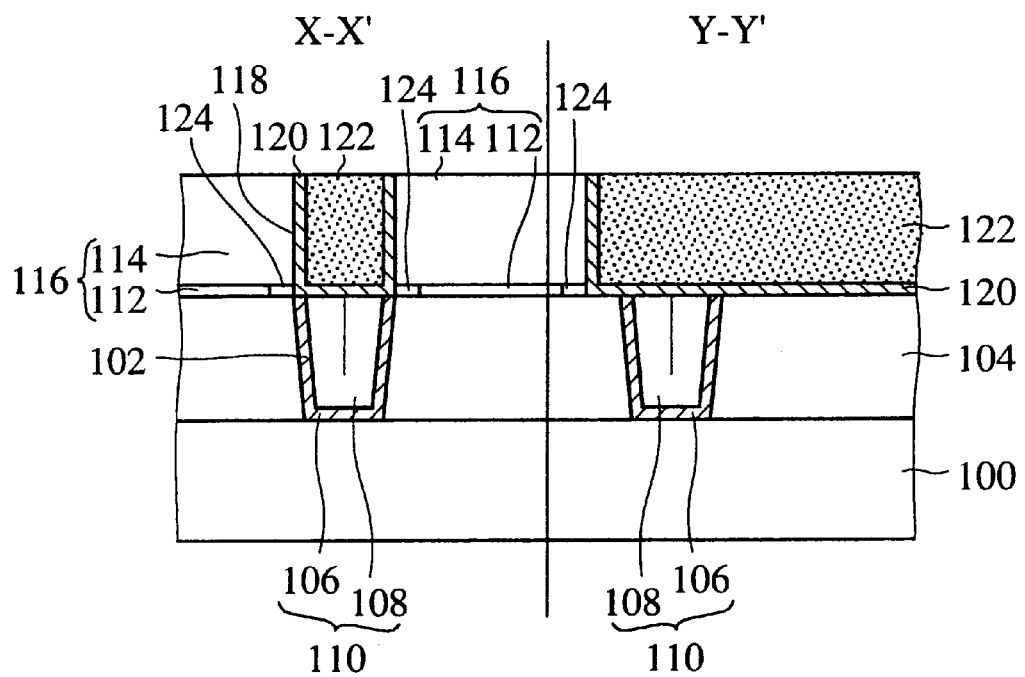
FIG. 10B is a sectional view of the semiconductor device according to the third embodiment, which explains a structure thereof.

FIGS. 8A–8D are views explaining buried wiring using BLC structure. FIGS. 9A–9C are views explaining the disadvantages of the buried wiring using Cu. FIG. 10A is a plan view and a sectional view of the semiconductor device according to the present embodiment showing its structure. FIG. 10B is a sectional view of the semiconductor device according to the present embodiment show its structure. FIGS. 11A–11C and 12A–12B are sectional views of the semiconductor device according to the present embodiment at the steps of the method for fabricating the same explaining the method.

In the first and the second embodiments, the present invention is applied to cases in which contact holes are opened on semiconductor substrates, but the BLC structure according to the present invention is applicable to various base structures.

That is, the present invention solves the disadvantages which are common in the processes for burying conducting materials in openings, and is effective not only in forming plugs in contact holes opened in a semiconductor substrate, but also in the process of filing plugs in other contact holes, e.g., via-holes, the process of forming buried wiring, and other processes.

In the present embodiment, a case in which BLC structure is applied to buried wiring will be explained.

First, buried wiring, and buried wiring using BLC structure will be explained.

As a speed increase of LSIs is required, a resistance decrease of wiring materials is required. To realize this requirement, new low-resistance materials, such as Cu (copper), are studied as a wiring material.

However, because Cu generates no reaction products of high vapor pressure, it is difficult to use Cu in patterning methods, such as RIE (Reactive Ion Etching), which use reactions, and formation of micronized wiring is difficult.

As a countermeasure, in forming wiring of Cu, it is effective to form in advance grooves for the wiring in the insulation film, burying Cu in the groove by sputtering, and then etching back (polishing back) the Cu on the insulation film by CMP, whereby the wiring buried in the insulation film can be formed.

The above-described BLC structure is applicable to the formation of such buried wiring. A case in which the BLC structure is applied to buried wiring will be explained with reference to FIGS. 8A–8D.

Figure 8A:
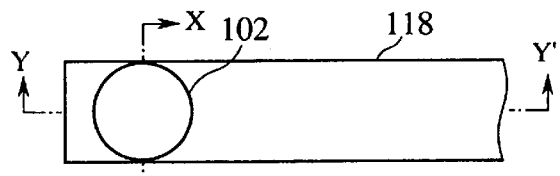
Figure 8B:
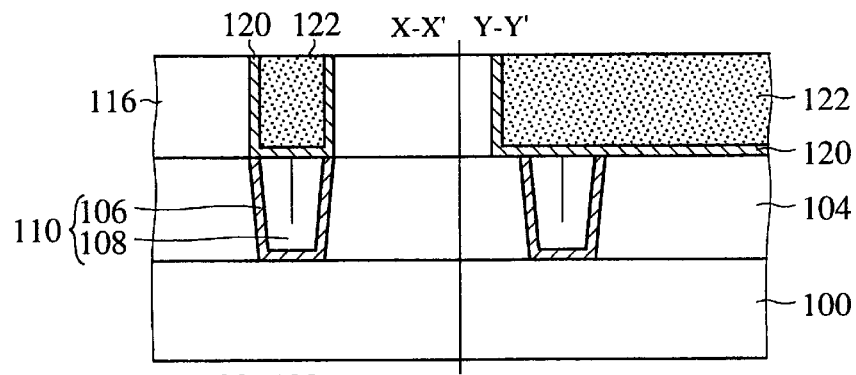
Figure 8C:
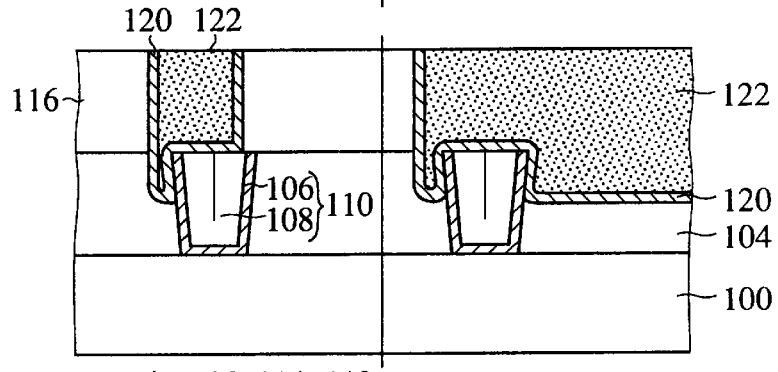

As shown in FIGS. 8A and 8B, in a case that a contact plug 110 is buried in an inter-layer insulation film 104 formed on a semiconductor substrate 100, and wiring 122 buried in an inter-layer insulation film 104 is formed thereon, it is necessary that in etching a wiring groove 118 by which the wiring 122 is to be buried in the inter-layer insulation film 116, the inter-layer insulation film 104 is kept from the etching. This is because when the etching reaches the inter-layer insulation film 104, a shape of the wiring 122 buried in the wiring groove 118 is much affected (FIG. 8C). Such deformation of a shape of the wiring 122 increases deflections of a wiring resistance and decreases an inter-layer breakdown voltage between the wiring 122 and lower wiring (not shown), which affects reliability of the semiconductor device.

Here the use of the BLC structure can prevent excessive etching of the inter-layer insulation film 104.

Figure 8D:
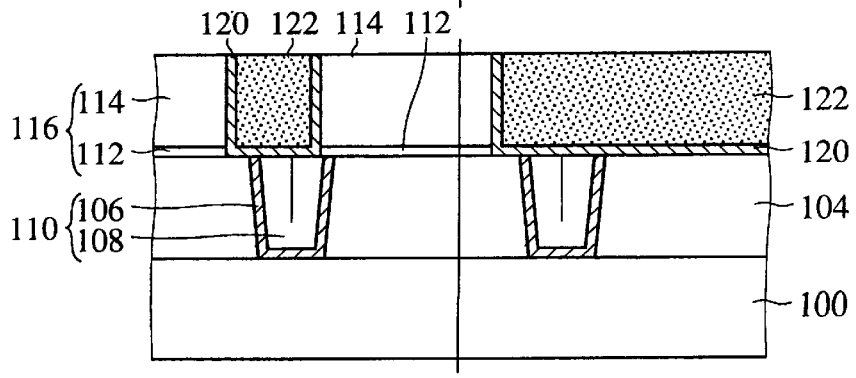

That is, an etching stopper film 112 having a different etching selectivity from the inter-layer insulation film 104 and the inter-layer insulation film 116 is formed between the inter-layer insulation films 104, 116, whereby the etching of the inter-layer insulation film 116 is stopped under good control (FIG. 8D).

This prohibits the etching of the wiring groove 118 for the wiring 122 to be buried in from affecting the inter-layer insulation film 104, and a shape of the wiring 122 is determined only by a thickness of the inter-layer insulation film 116, and the wiring can be stably formed.

However it is not preferable to apply the BLC structure as it is to a case in which Cu is used as a material of the buried wiring material. The reason for this will be explained next.

Also in forming the buried wiring of Cu, it is preferable to use wet etching for etching the etching stopper film 112 so as to secure etching selectivity between the inter-layer insulation film 104 and the insulation film 114. The wet etching, however, is isotropic etching and even the etching stopper film 112 below the insulation film 114 is etched, forming a cavity 124 below the insulation film 114 (FIG. 9A). The thus formed cavity 124 cannot be covered by the usual sputtering, and resides after the conducting film 120 is deposited (FIG. 9B).

When Cu is filled in the next wiring process, the Cu is filled in the cavity 124, and the Cu is diffused from here into the insulation film 114, increasing leak current between the wirings and dielectric constants of the insulation film (FIG. 9C).

Thus, it is not preferable that the conventional BLC structure is applied as it is to the buried wiring of Cu.

Then, a structure of the semiconductor device according to the present embodiment will be explained with reference to FIGS. 10A and 10B. FIG. 10A is a plan view of the structure of the semiconductor device according to the present embodiment, and FIG. 10B is a sectional view of the structure of the semiconductor device according to the present embodiment.

The inter-layer insulation film 104 with the contact hole 102 formed in a set region is formed on the semiconductor substrate 104. The contact plug 110 constituted by the conducting film 106 and the plug 108 is formed in the contact hole 102.

The inter-layer insulation film 116 constituted by the etching stopper film 112 and the insulation film 114 is formed on the base substrate with the contact plug 110 exposed on the surface of the inter-layer insulation film 104. The wiring groove 118 is formed in the inter-layer insulation film 116, and the contact plug 110 is exposed on the bottom of the groove.

The conducting film 120 to be a barrier metal is formed on the inside wall of the wiring groove 118 and on the inter-layer insulation film 104, and the wiring 122 is buried in the wiring groove 118 with the conducting film 120 formed in.

The semiconductor device according to the present embodiment is characterized in that the etching stopper film 112 near the wiring groove 118 is etched, forming the cavity 124, but the conducting film 120 formed in the wiring groove 118 is not interrupted at the cavity 124 and completely encloses the interior of the wiring groove 118.

Then the method for fabricating the semiconductor device according to the present embodiment will be explained with reference to FIGS. 11A–11C and 12A–12B.

First, the inter-layer insulation film 104 with the contact plug 110 buried in is formed on the semiconductor substrate 100. The contact plug 110 is connected to the electrodes, etc. (not shown) of the transistors formed on the semiconductor substrate 100. The inter-layer insulation film 104 is formed of, e.g., silicon oxide film.

Here the contact plug 110 may have any structure.

One, or two or more wiring layers may be formed between the semiconductor substrate 100 and the inter-layer insulation film 104. That is, the wiring 122 may be the second layer of metal wiring or the upper layer of metal wiring.

In the specification of the present application, such base structure as a whole is called a base substrate. That is, the base substrate in the specification of the present application also covers the structure including the semiconductor substrate, semiconductor substrate having transistors or other elements, and one or more than two wiring layers formed on the semiconductor substrate.

Then, an insulation film to be the etching stopper film 112 is formed on the base substrate. The etching stopper film 112 can be formed of, e.g., SiN film. The etching stopper film 112 is deposited, for example, by plasma CVD, at a 400° C. substrate temperature, at a 300 W power, a 100 cc $SiH_4$ flow rate and a 50 cc $NH_3$ flow rate.

Figure 11A:
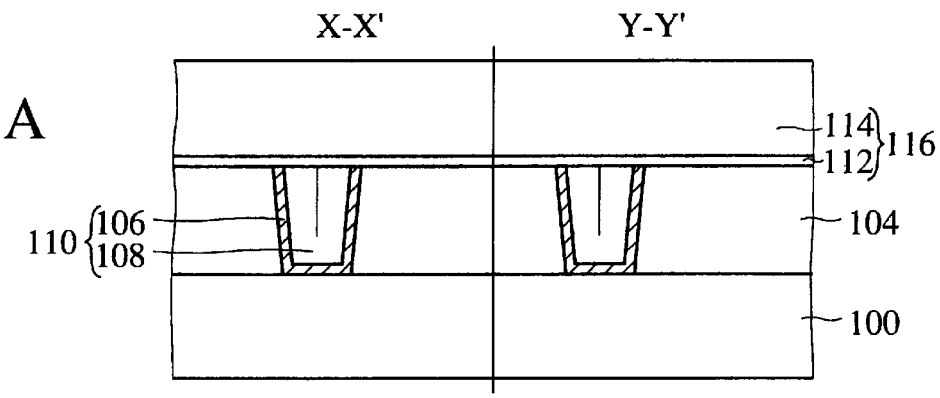
FIGS. 11A–11C are sectional views of the semiconductor device according to the third embodiment of the present invention in the steps of the method for fabricating the same, which explain the method (Part 1).

Subsequently, the insulation film 114 is deposited on the etching stopper film 112, and the inter-layer insulation film 116 constituted by the etching stopper film 112 and the insulation film 114 is formed (FIG. 11A). The insulation film 114 can be formed of, e.g., $SiO_2$ film. The insulation film 114 is deposited, for example, by plasma CVD, at a 400° C. substrate temperature, at a 300 W power, at 50 cc $SiH_4$ flow rate and at a 500 cc $N_2O$ flow rate.

Figure 11B:
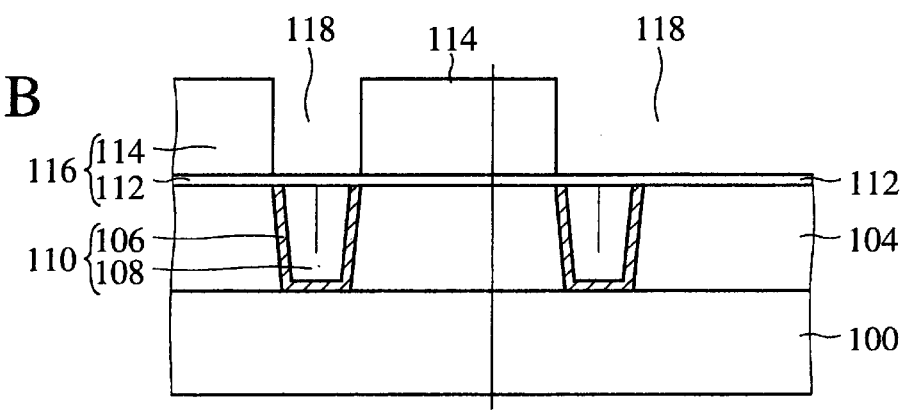

Then, the wiring groove 118 is opened through the insulation film 114 down to the etching stopper film 112 by the usual lithography and isotropic etching (FIG. 11B). At this time, etching conditions are so set that an etching speed of the etching stopper film 112 is sufficiently lower than that of the insulation film 114 of $SiO_2$ the insulation film 112 of $SiO_2$, whereby the etching of the wiring groove 118 never reaches the inter-layer insulation film 104 and the contact plug 110.

Figure 11C:
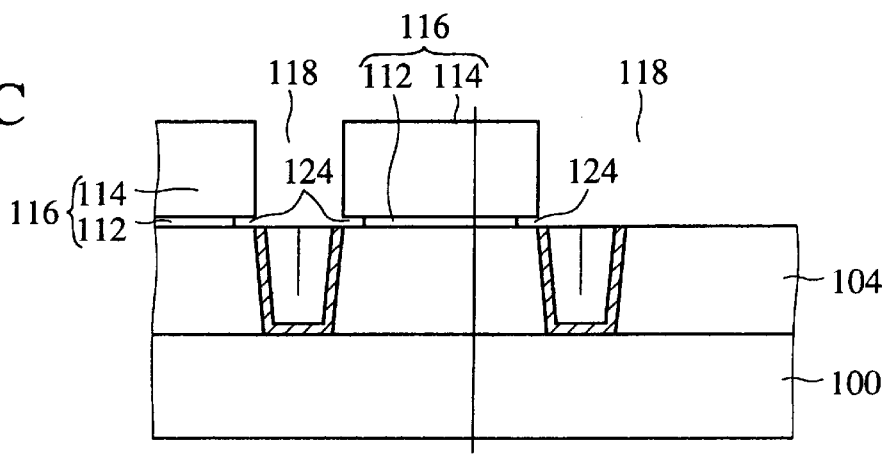

Next, the etching stopper film 112 in the wiring groove 118 is removed by isotropic etching (FIG. 11C). The bottom of the wiring groove 118 thereby reaches the inter-layer insulation film 104 and the contact plug 110 while the etching stopper film 112 below the insulation film 114 near the wiring groove 118 is etched, and the cavity 124 is formed. The isotropic etching is conducted by wet etching, e.g., at 100° C. with an aqueous solution of 90% phosphoric acid.

Figure 12A:
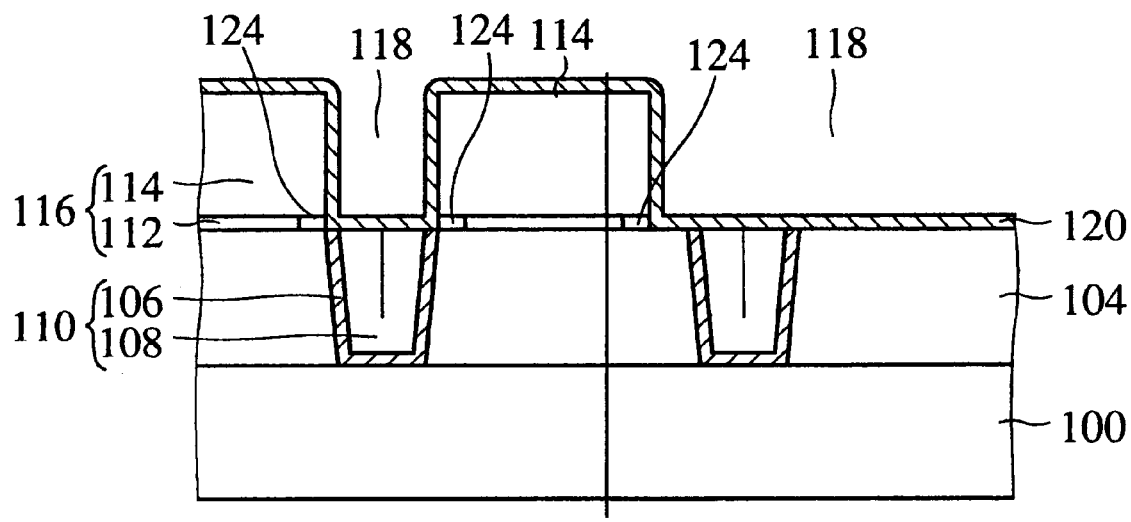
FIGS. 12A and 12B are sectional views of the semiconductor device according to the third embodiment of the present invention in the steps of the method for fabricating the same, which explain the method (Part 2).

Subsequently, the conducting film 120 is formed to cover the opening of the cavity 124 (FIG. 12A). Here the conducting film 120 is to be a barrier layer for prohibiting a wiring material from intruding into the cavity 124, and has the effect of isolating the inter-layer insulation films 104, 116 from the wiring groove 118.

It is necessary to form the conducting film 120 so as to cover at least the opening of the cavity 124, and a thickness of the conducting film 120 to be formed must at least be approximately equal to a height of the opening of the cavity. Accordingly, to deposit the conducting film 120 it is preferable to use collimated sputtering (see the first embodiment).

Then, Cu film is deposited by sputtering to bury the Cu in the wiring groove 118. The Cu is sputtered, for example, at a 1.5 mTorr pressure, a 5 kW power, a 25 sccm Ar low rate, and the Cu is reflowed, for example, at 350° C., a 1000 sccm Ar flow rate and a 80 Torr pressure.

Figure 12B:
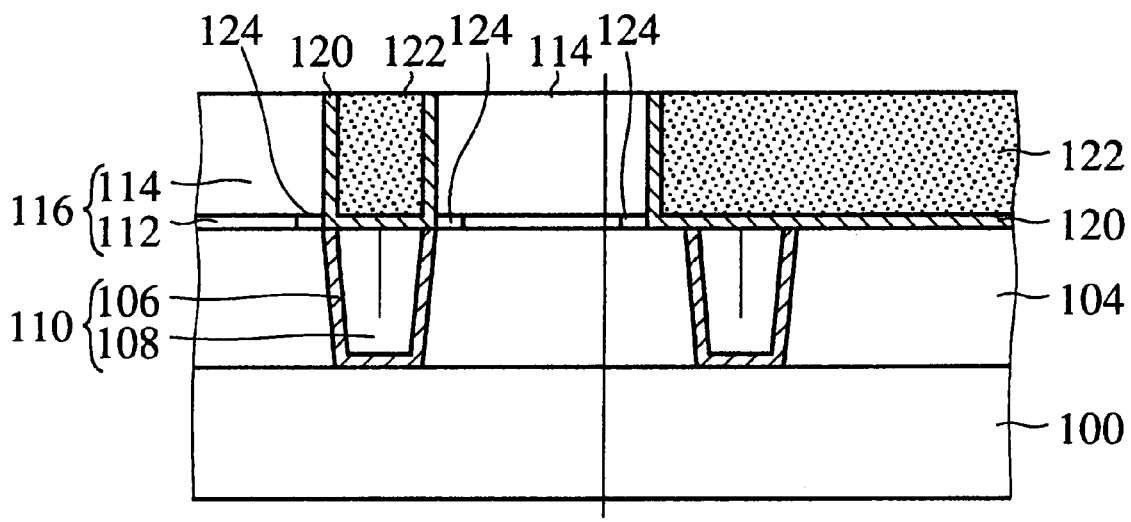

Next, the Cu on the inter-layer insulation film 116 and, conducting film 120 are removed by CMP to leave the Cu and the conducting film 120 only on the inter-layer insulation film 116. For example, the CMP is conducted, with an aluminum-based abrasive agent, at a 100 rpm rotation number and at a 6 psi abrasion pressure. Thus the wiring 122 buried in the wiring groove 118 is formed (FIG. 12B).

The Cu may be buried by CVD method. The Cu is deposited, for example, at a 0.08 g/min flow rate of Cu(TMVS)(HFAC), at a 300 cc flow rate of $H_2$ carrier gas, at 200° C. and at a 200 mTorr pressure.

Here the wiring 122 is formed of Cu, which is easily diffused in silicon oxide film, but the inter-layer insulation films 104, insulation film 114 of silicon oxide film are isolated from the wiring 122 by the conducting film 120. The conducting film 120 of TiN film is an effective diffusion barrier for the Cu, and prevents the Cu from diffusing into the inter-layer insulation films 104, 116. Leak current between the wirings and increases of dielectric constants of the inter-layer insulation film, etc. can be prevented.

As described above, according to the present invention, the cavity 124 formed by the isotropic etching of the etching stopper film 112 is spaced by the deposition of the conducting film 120, whereby when the Cu is buried in the wiring grove 118, the inter-layer insulation films 104, 116 do not directly contact with each other, so that leak current between the wirings, increases of dielectric constants of the inter-layer insulation film, etc., due to the diffusion of the Cu, can be prevented.

The present invention is not limited to the above-described embodiment and covers various modifications.

In the above-described embodiment, the present invention is applied to formation of the buried wiring, but may be applied to filling, for example via-holes for the inter-layer connection between multi-wiring layers. In such case the wiring groove 118 is replaced by a via-hole.

In the above-described embodiment, the conducting film 120 is formed by, e.g., collimated sputtering, but as in the second embodiment, the conducting film 120 may be deposited by CVD. In this case, the cavity 124 can be completely filled with the conducting film 120.

The conducting film 120 is formed of a material which is effective as a diffusion barrier for Cu, such as WN film, Ta film, TaN film TiSiN film, WSiN film, or others, whereby the diffusion of Cu and Al to the interior of the cavity can be more effectively prohibited.

A method for isotropically etching the etching stopper film 112 is exemplified by wet etching using an aqueous solution of phosphoric acid, but in a case that the plug 110 exposed on the bottom of the wiring groove 118 is formed of Al or Cu, the isotropic dry etching is used to etch the etching stopper film 112 without any affection to the plug 110. Here the isotropic dry etching is conducted, for example, at a 120 cc $SF_6$ flow rate, a 30 cc $O_2$ flow rate, a 200 W power, a 200 mTorr pressure and at 20° C.

The above-described processing conditions are merely one example, and suitable changes of the values do not affect the advantages of the present invention.

A Fourth Embodiment

The semiconductor device according to a fourth embodiment of the present invention and a method for fabricating the same will be explained with reference to FIGS. 13, 14A–14C, 15A–15B, 16A–16B, and 17A–17B. The same members of the fourth embodiment as the first embodiment are represented by the same reference numerals not to repeat or to simplify their explanation.

Figure 13:
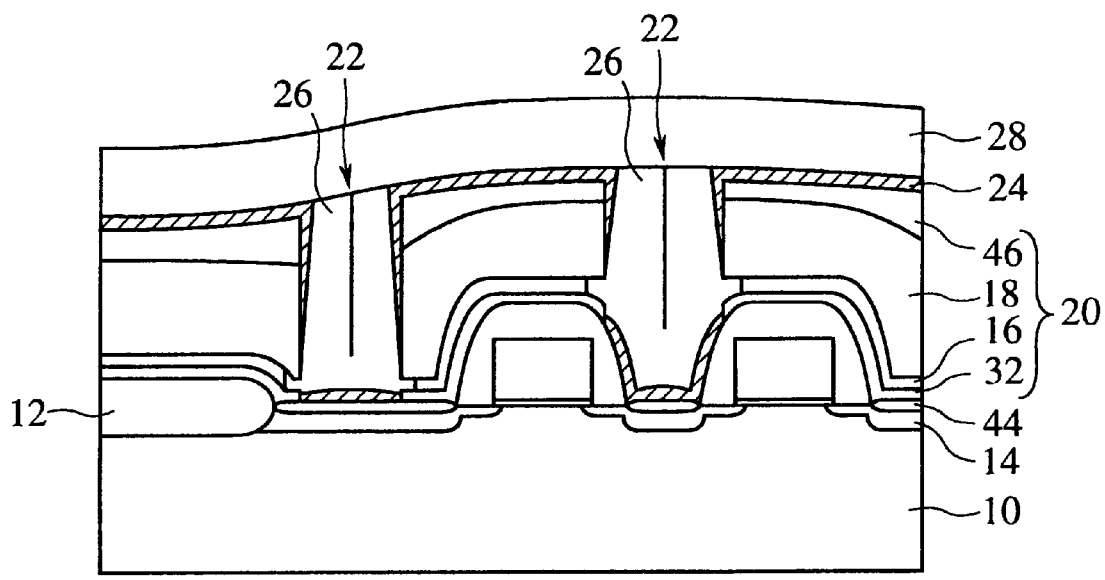
FIG. 13 is a schematic sectional view of the semiconductor device according to a fourth embodiment of the present invention, which explain a structure thereof.

FIG. 13 is a schematic sectional view of the semiconductor device according to the present embodiment, which shows its structure. FIGS. 14A–14C, 15A–15B, 16A–16B, and 17A–17B are sectional views of the semiconductor device according to the present embodiment at the steps of the method for the same, which explain the method.

The semiconductor device according to the present embodiment is characterized in that an insulation film 32 is further provided below an etching stopper film 16, and that a contact hole 22 formed in an inter-layer insulation film 20 has a width which varies depthwise.

This is, a part of the etching stopper film 16 near the hole 22 is horizontally etched, and the contact hole 22 has an increased width in the etching stopper film 16. A width of the contact hole 22 in an insulation film 32 is substantially the same as that of the contact hole 22 in an insulation film 18 and is smaller than that thereof in the etching stopper film 16.

A conducting film 24 formed in the contact hole 22 is interrupted at the etching stopper film 16, but the opening formed in the insulation film 32 is completely covered by the conducting film 24 formed on the bottom of the contact hole 22. The semiconductor substrate 10 is not exposed in the contact hole 22.

The semiconductor device is thus constituted, whereby the semiconductor substrate 10 is kept from erosion by raw processing gases in forming a plug 26.

Next, the method for fabricating the semiconductor device according to the present embodiment will be explained.

An approximately 250 nm-thick device isolation film 12 is formed on the primary surface of the semiconductor substrate 10. Then, a well, a channel stopper layer and a threshold voltage control doped layer (which are not shown) are formed in required regions.

Subsequently, an approximately 6 nm-thick gate oxide film 34 is formed by thermal oxidation, and an approximately 200 nm-thick amorphous silicon film is deposited on the gate oxide film 34 by CVD.

Next, P (phosphorus) ions are implanted in that portion of the amorphous silicon film in a region where an N-channel transistor is to be formed, and $BF_2$ (boron fluoride) ions are implanted in that portion of the amorphous silicon film in a region where a P-channel transistor is to be formed.

Next, an approximately 80 nm-thick silicon oxide film is deposited on the amorphous silicon film by CVD.

Figure 14A:
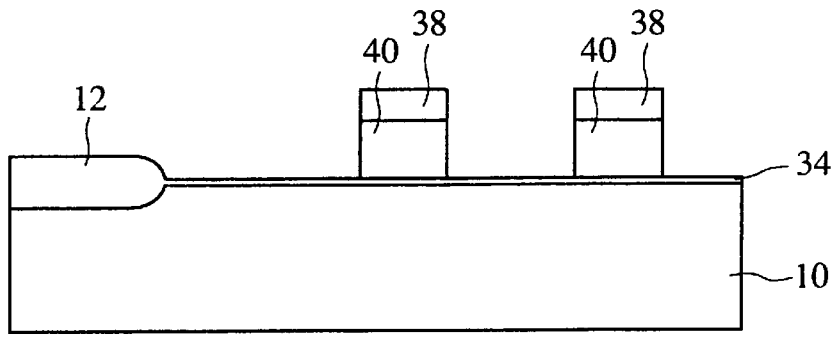
FIGS. 14A–14C are sectional views of the semiconductor device according to the fourth embodiment of the present invention at the steps of the method for fabricating the same, which explain the same (Part 1).

Subsequently, the laminated film of the amorphous silicon film and the silicon oxide film 38 is patterned by photolithography and RIE (Reactive Ion Etching) to form a gate electrode 40 (FIG. 14A).

Then, with the gate electrode as a mask, the semiconductor substrate 10 is doped to form an LDD (Lightly Doped Drain).

An approximately 100 nm-thick silicon oxide film is deposited by CVD and etched back to form a sidewall 42 on the sidewall of the gate electrode.

Next, with the gate electrode and the sidewall 42 as a mask, the semiconductor substrate 10 is doped to form a source/drain diffused layer 14.

Figure 14B:
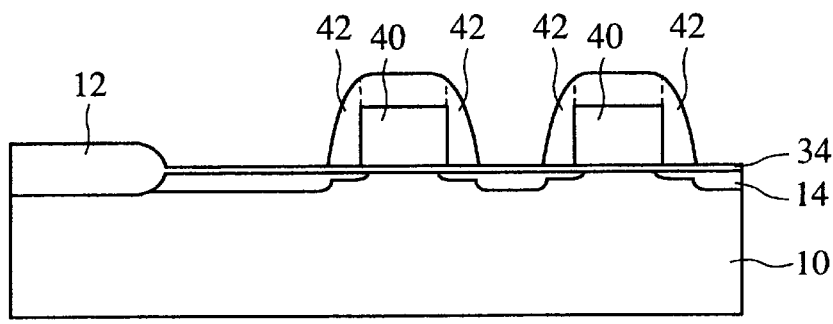

Then, the doped impurities are activated by a 800° C. thermal treatment (FIG. 14B).

Then, an approximately 8 nm-thick Co (cobalt) film and an approximately 15 nm-thick TiN film are continuously deposited by sputtering and are then subjected to RTA (Rapid Thermal Annealing) at 550° C. to form a $CoSi_2$ film 44 selectively on the source/drain diffused layer 14.

Figure 14C:
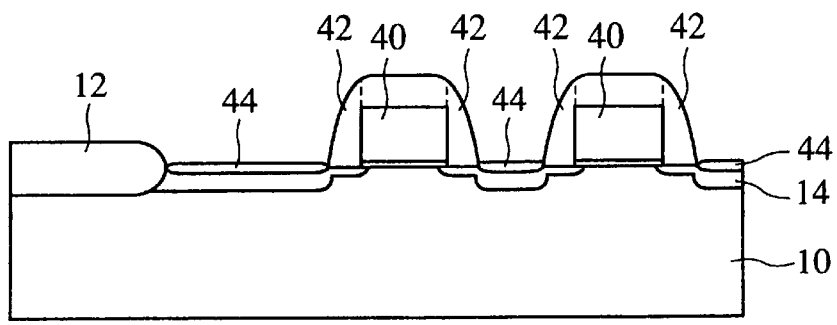

Subsequently, the TiN film is removed by an aqueous solution of ammonia and hydrogen peroxide, and the unreacted Co film is removed by an aqueous solution of sulfuric acid and hydrogen peroxide (FIG. 14C).

After a MOS transistor including the $CoSi_2$ film 44 selectively formed on the source/drain diffused layer 14 is formed on the semiconductor substrate 10, the insulation film 32 of an approximately 10 nm-thick silicon oxide film and the etching stopper film 16 of an approximately 50 nm-thick SiN film and the insulation film 18 of an approximately 250 nm-thick silicon oxide film are deposited by PECVD (plasma-enhanced CVD). Then, the SOG (spin on glass) film 46 is applied to the insulation film 18 by spin coating, and the inter-layer insulation film 20 having a planarized surface is formed.

Figure 15A:
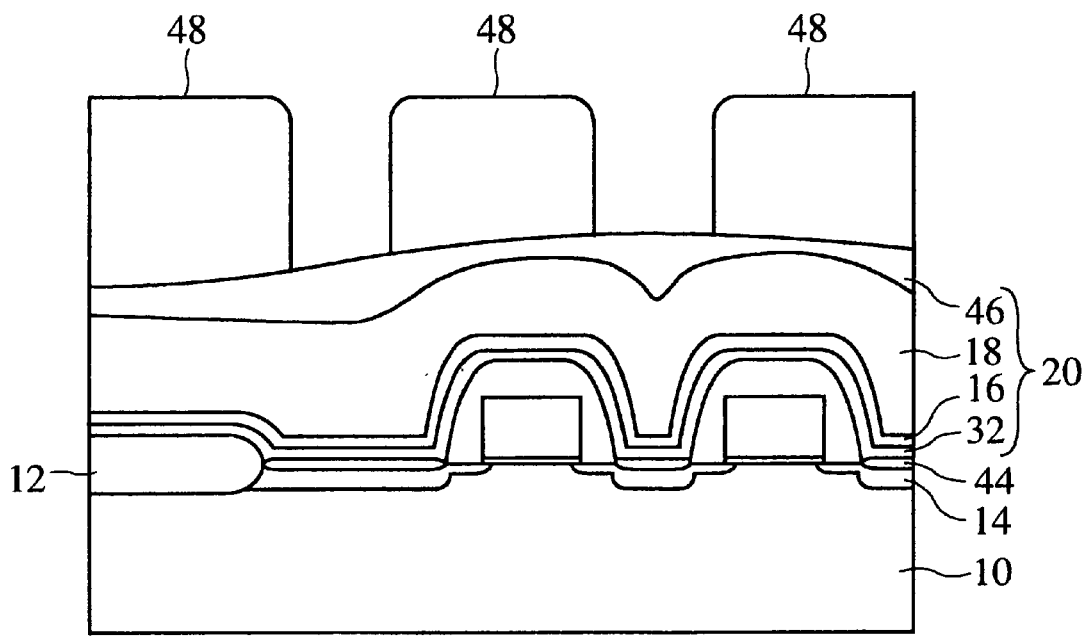
FIGS. 15A and 15B are sectional views of the semiconductor device according to the fourth embodiment of the present invention in the steps of the method for fabricating the same, which explain the method (Part 2).

Then, a resist film 48 having a pattern of the contact hole to be formed is formed on the SOG film 46 by lithography (FIG. 15A).

Figure 15B:
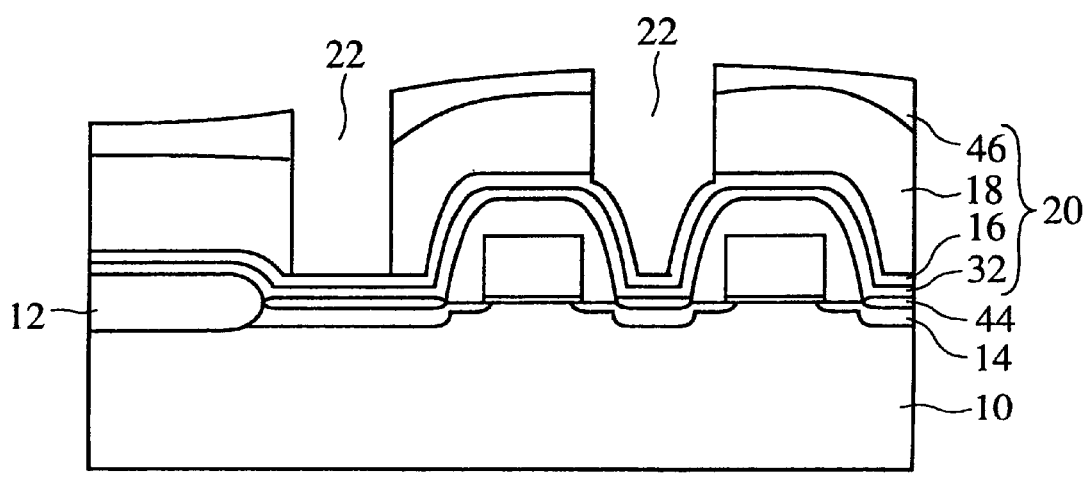

Then, with the resist film as a mask, the SOG film 46 and the insulation film 18 are processed by etching by plasma of a mixed gas of $C_4F_8$ and Ar. The etching stopper film 16 is SiN film, but that portion of the SiN film on the shoulder of the gate electrode is worn down by about half of the total film thickness (FIG. 15B).

Figure 16A:
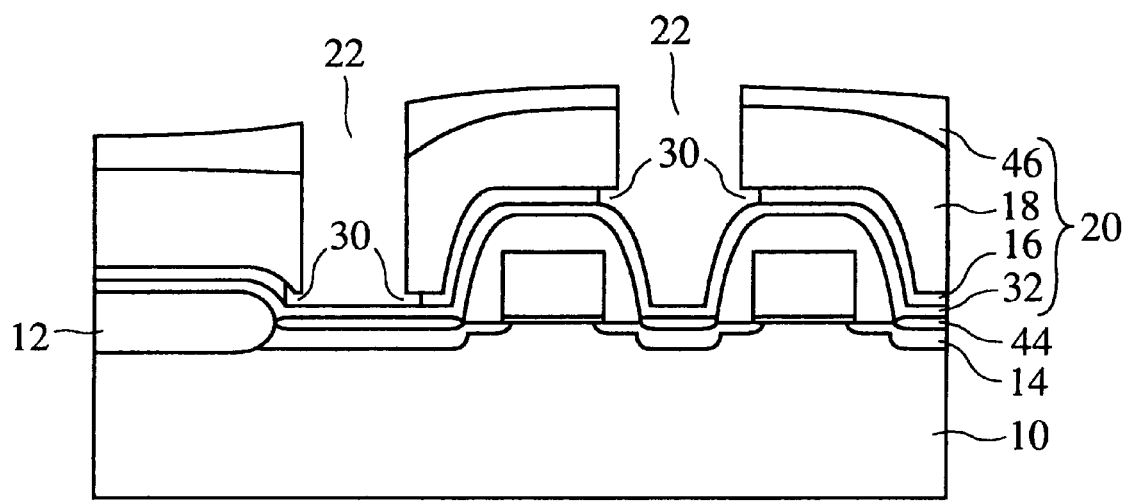
FIGS. 16A and 16B are sectional views of the semiconductor device according to the fourth embodiment of the present invention in the steps of the method for fabricating the same, which explain the method (Part 3).

After the resist film 48 is removed, the substrate is immersed in an aqueous solution of phosphoric acid of 150° C. to remove the SiN film as the etching stopper film 16. The etching using phosphoric acid can secure a selectivity of about 50 between the SiN film and the silicon oxide film, and accordingly, substantially no wear of the insulation film 32 as the base takes place. The etching using phosphoric acid etching, which is isotropic, etches the SiN film horizontally as well, whereby the insulation film 18 overhangs, forming a cavity 30 (FIG. 16A).

Figure 16B:
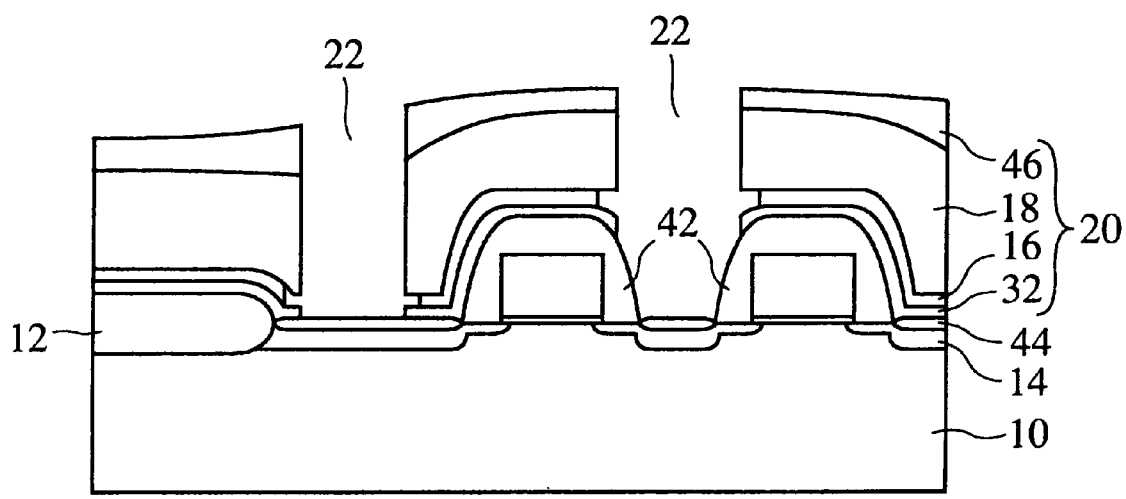

Subsequently, the insulation film 32 of the silicon oxide film is anisotropically etched by plasma of a mixed gas of $CF_4$, $CHF_3$ and Ar. In this etching, the upper insulation film 18 functions as the mask, and only that portion of the insulation film 32 immediately below the opening formed in the overhanging insulation film 18 is removed. (FIG. 16B).

At this time, by setting overetching at below about 50%, wear of the sidewall 42 covering the gate electrode can be sufficiently reduced. An electrical short with the plug 26 to be formed later can be prevented. In the case that a boundary between the device isolation film 12 and the device region is present in the contact hole 22, wear of the device isolation film 12 can be sufficiently reduced, and a junction short can be prevented.

Figure 17A:
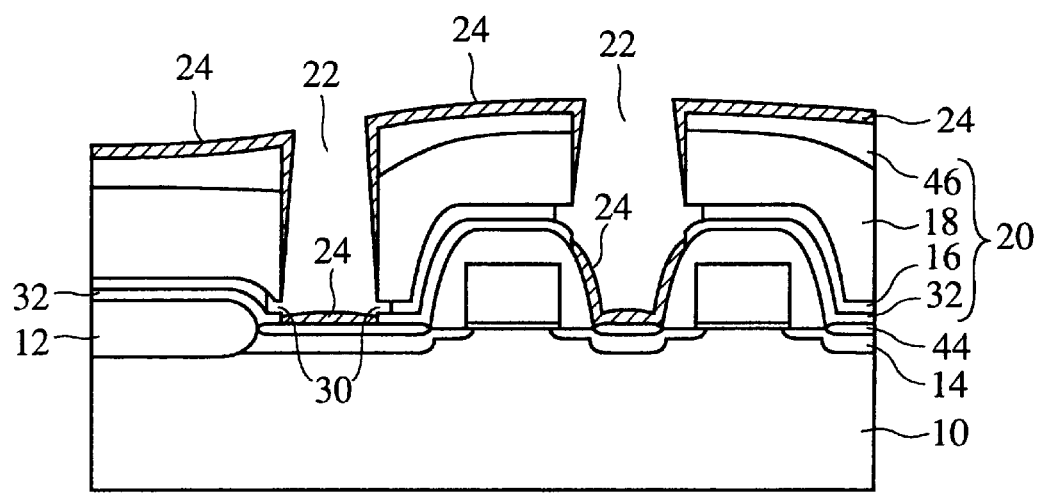
FIGS. 17A and 17B are sectional views of the semiconductor device according to the fourth embodiment of the present invention in the steps of the method for fabricating the same, which explain the method (Part 4).

Then, the conducting film 24 of an approximately 70 nm-thick TiN film is formed by sputtering. At this time the TiN film is deposited on the bottom of the contact hole 22 but is not deposited in the cavity 30. However, after the conducting film 24 has been deposited, the semiconductor substrate 10 is not exposed in the contact hole 22 because of the insulation film 32 remaining in the cavity 30. Thus, even when a little overhang occurs in depositing the conducting layer 24, the conducting film 24 can cover the semiconductor substrate 10, which permits the use of the usual sputtering method (FIG. 17A).

Then, an approximately 600 nm-thick W film is deposited by CVD. Because the semiconductor substrate 10 is not exposed in the contact hole 22 as described above, in depositing the W film, $WF_6$ gas does not contact the semiconductor substrate 10. The semiconductor substrate 10 is kept from the erosion, and accordingly junction breakdown can be precluded.

Subsequently, W is etched back in order to form the plug 26 left in the contact hole.

Figure 17B:
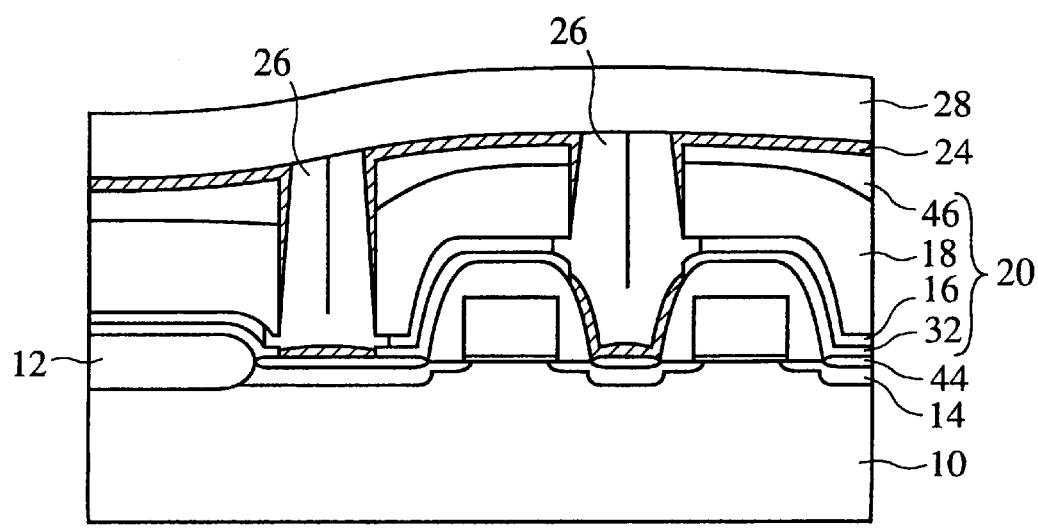

Then, a wiring layer 28 is formed thereon, and a wiring layer (not shown) may be further formed thereon as required (FIG. 17B).

As described above, according to the present embodiment, because of the insulation film 32 below the etching stopper film 16, that portion of the semiconductor substrate 10 on the bottom of the contact hole 22 can be completely covered by the conducting layer even when the insulation film 18 overhangs. The semiconductor substrate 10 can be kept from erosion in forming the plug 26.

This constitution permits etching having a high selectivity to be used in removing the etching stopper film 16. Even in a SAC in which the shoulder of the gate electrode 40 is present in the contact hole 22, the sidewall 42 on the gate electrode 40 and the insulation film 38 are prevented from being etched, which would expose the gate electrode 40.

The present invention is not limited to the present embodiment and covers other variations and modifications.

For example, the insulation film 32 immediately below the etching stopper film 16 is an $SiO_2$ film, but may be SiON film instead.

The SiN film is removed by wet etching using an aqueous solution of phosphoric acid, but downflow of plasma of a mixed gas of $CF_4$ and $O_2$ may be used to react fluorine radicals. In this case, a selectivity of about 10 is available suitably for the above-described fabrication method. The addition of chlorine can greatly improve the selectivity between the silicon oxide film and the SiN film.

The SiN film may be removed by $SF_6$ gas plasma. In this case, the selectivity is a little lower, about 5, but is made usable in the above-described fabrication method by forming the insulation film 32 in an approximately 20 nm-thickness.

It is preferred that the thickness of the insulation film 32 is determined suitably depending on etching conditions for the SiN film.

In the present embodiment, the $CoSi_2$ film 44 is formed on the source/drain diffused layer 14 by self alignment, but the present embodiment is applicable to semiconductor devices having no $CoSi_2$ film 44.

The above-described process conditions are one example, and changes in their values do not affect the effects of the present invention.

A Fifth Embodiment

The semiconductor device according to a fifth embodiment of the present invention and the method for fabricating the same will be explained with reference to FIGS. 18A–18B, 19A–19C, and 20A–20B.

Figure 18A:
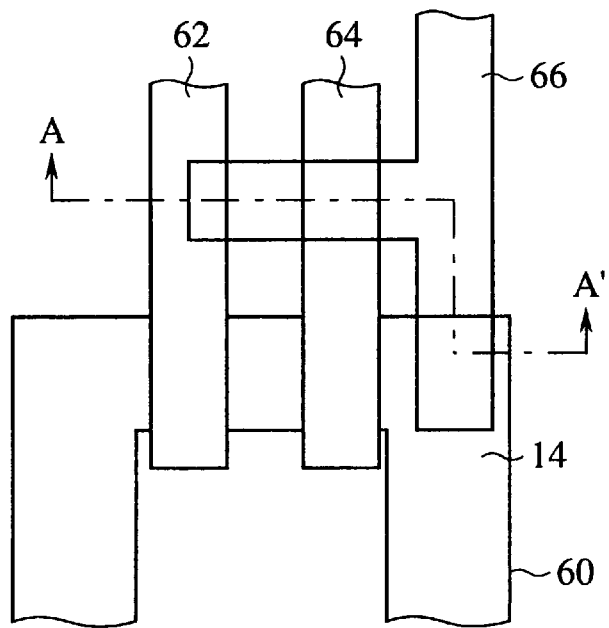
FIG. 18A is a plan view of the semiconductor device according to a fifth embodiment of the present invention.
Figure 18B:
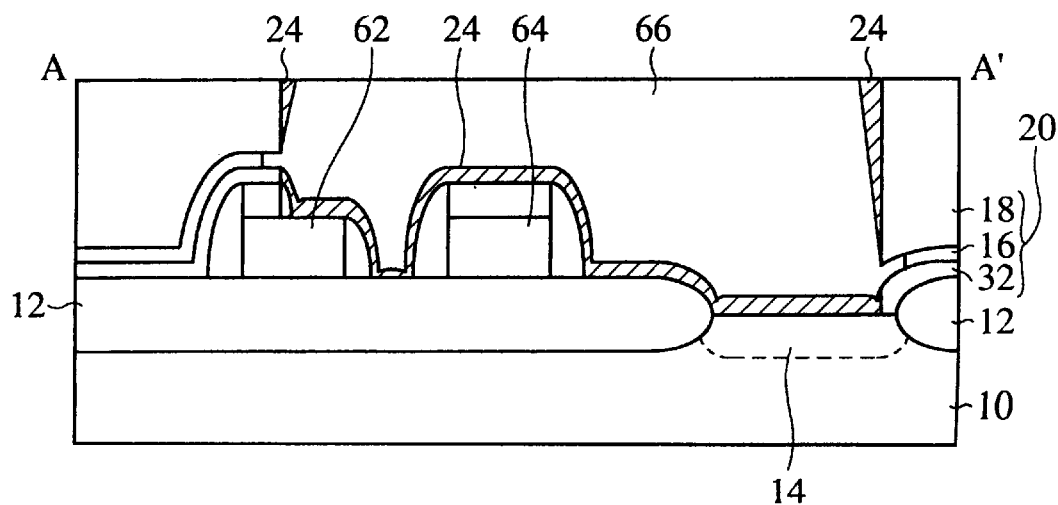
FIG. 18B is a sectional view of the semiconductor device according to a fifth embodiment of the present invention.

FIGS. 18A and 18B are schematic sectional views of the semiconductor device according to the present embodiment, which show a structure thereof. FIGS. 19A–19C and 20A–20B are sectional views of the semiconductor device according to the present embodiment in the steps of the method for fabricating the same, which explain the method.

In the present embodiment, a case that the semiconductor device according to the fourth embodiment and the method for fabricating the same is applied to a semiconductor device having buried wiring will be explained.

First, the structure of the semiconductor device according to the present embodiment will be explained with reference to FIGS. 18A and 18B. FIG. 18A is a plan view of the semiconductor device according to the present embodiment, which shows the structure thereof, and FIG. 18B is a schematic plan view of the semiconductor device according to the present embodiment, which shows the structure.

The buried wiring is also used in local wiring which directly contacts a semiconductor substrate in addition to the use in the wiring structure shown in the third embodiment. In the structure as shown in FIG. 18A, for example, gate electrodes 62, 64 are arranged side by side on a device region 60, wiring 66 connected to the device region 66 with the gate electrode 62 can be in the form of buried wiring.

Figure 37A:
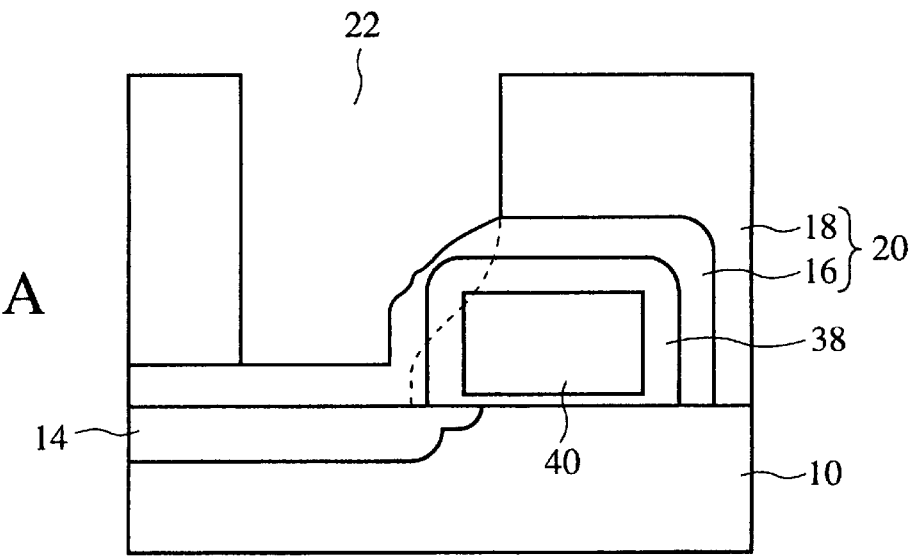
FIGS. 37A and 37B are explanatory views of disadvantages of a conventional semiconductor device (Part 6).
Figure 37B:
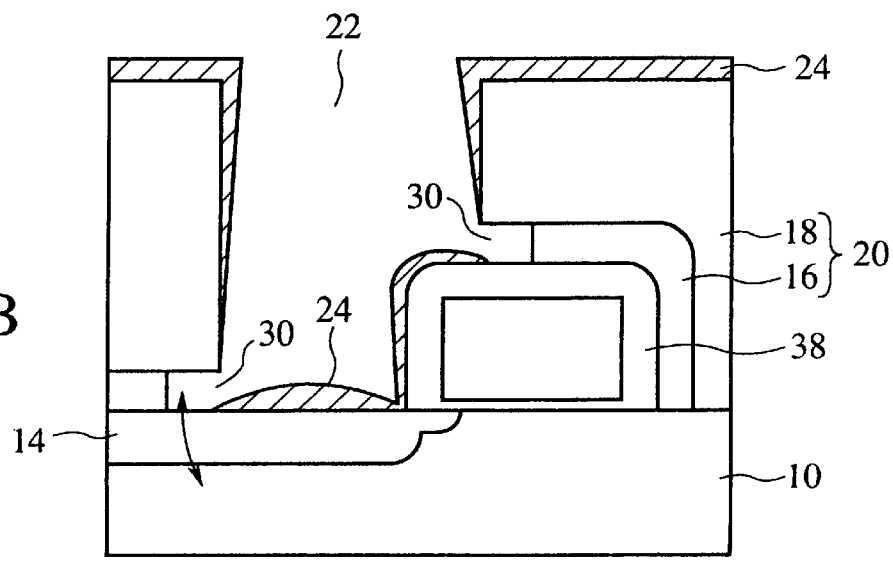
Figure 38A:
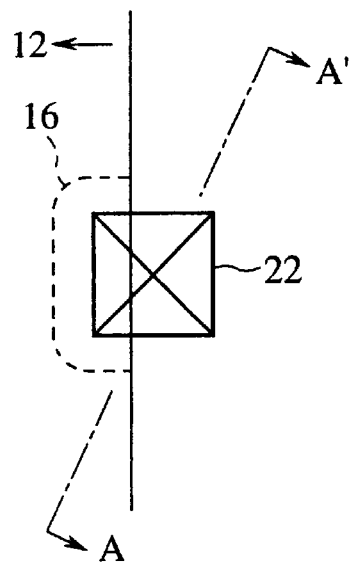
FIGS. 38A and 38B are explanatory views of disadvantages of a conventional semiconductor device (Part 7).
Figure 38B:
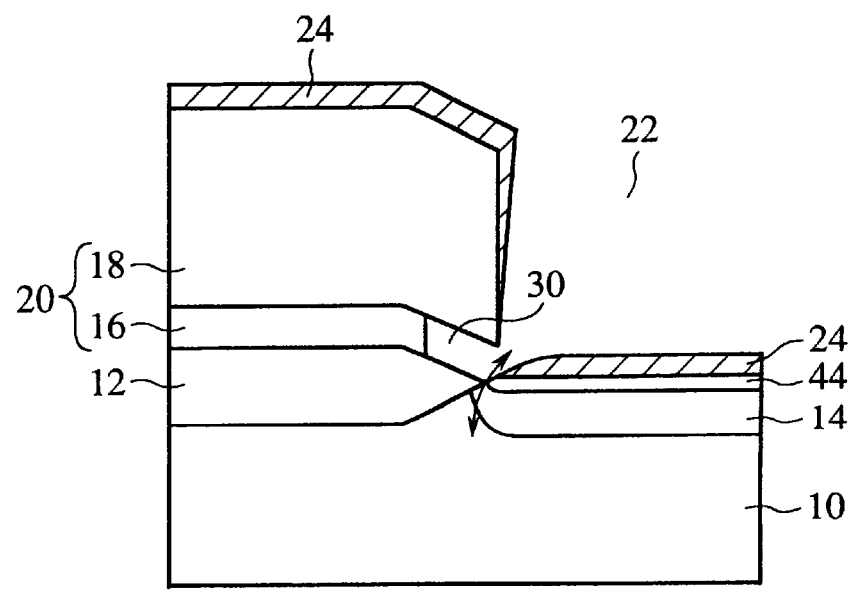
Figure 39:
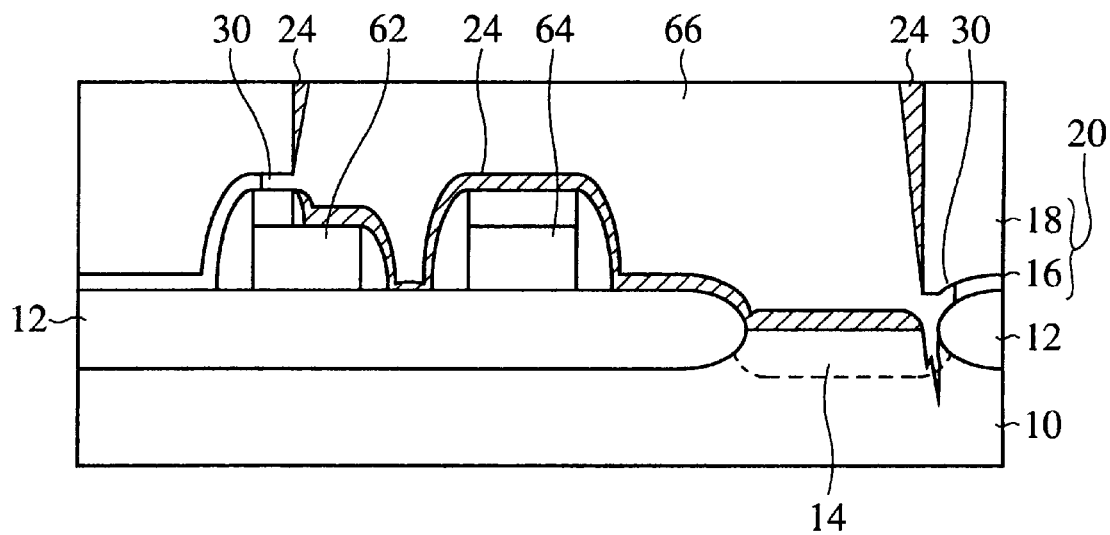
FIG. 39 is an explanatory view of disadvantages of a conventional semiconductor device (Part 8).

In such semiconductor device, to form in the BLC structure a wiring groove 68 for the wring to be buried in, as in the conventional semiconductor device shown in FIG. 37B, junction spiking takes place at a cavity 30 (FIG. 39).

In the semiconductor device according to the present embodiment, an insulation film 32 is further formed below an etching stopper film 16, and the wiring groove 68 formed in an inter-layer insulation film 20 has opening widths which are varied depthwise (FIG. 18B).

That is, the etching stopper film 16 near the wiring groove 68 is horizontally etched, and the wiring groove 68 has a larger opening width. In the insulation film 32, however, the wiring groove 68 has substantially the same width as in an insulation film 18, and has a smaller width than in the etching stopper film 16.

A conducting film 24 formed in the wiring groove 68 is interrupted at the etching stopper film 16, but the opening formed in the insulation film 32 is completely covered by the conducting film formed on the bottom of the wiring groove 68, and the semiconductor substrate 10 is not exposed in the wiring groove 68.

The semiconductor device has such structure, whereby erosion of the semiconductor substrate by a raw material gas in forming the wiring 66 can be prevented, and junction spiking due to reaction between a wiring material and the semiconductor substrate 10 can be prevented.

Then, the method for fabricating the semiconductor device according to the present embodiment will be explained with reference to FIGS. 19A–19C and 20A–20B. These step views are sectional views along the line A–A' in FIG. 18A.

Figure 19A:
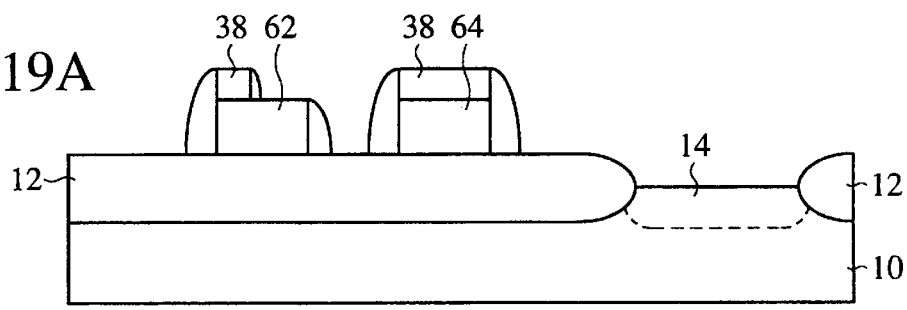
FIGS. 19A–19C are sectional views of the semiconductor device according to the fifth embodiment of the present invention in the steps of the method for fabricating the same, which explain the method (Part 1).

First, a MOS transistor is formed on the primary surface of the semiconductor substrate 10 in the same way as in the method for fabricating the semiconductor device according to, e.g., the fourth embodiment. At this time, the silicon oxide film 38 on a prescribed region of the gate electrode 62, which (region) is to be connected to the wiring in a later step is removed in advance (FIG. 19A).

Figure 19B:
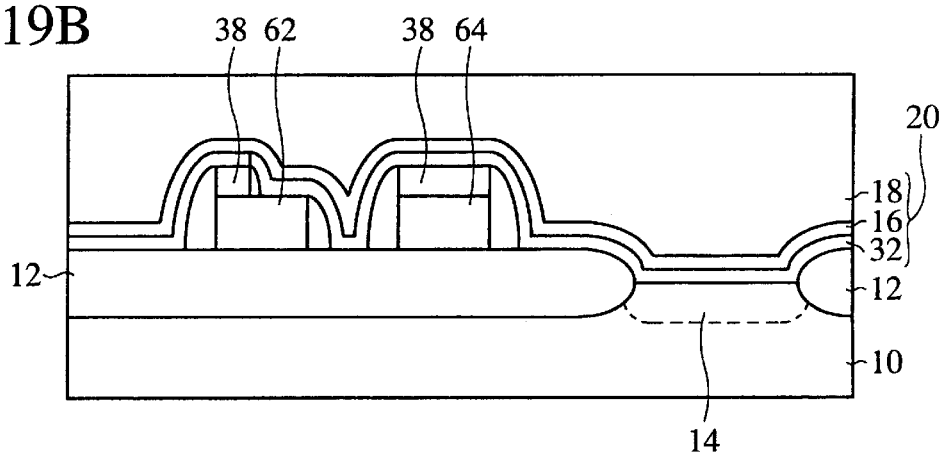

After the MOS transistor is thus formed, the insulation film 32 of an approximately 10 nm-thick silicon oxide film, the etching stopper film 16 of an approximately 50 nm-thick SiN film, and the insulation film 18 of an approximately 250 nm-thick silicon oxide film are deposited by PE-CVD. Then, the surface of the insulation film 18 is polished by CMP, and the insulation film 20 having the surface planarized is formed (FIG. 19B).

Then, the insulation film 18 is processed into a pattern of the buried wiring to be formed by the usual lithography and etching. The etching of the insulation film 18 is conducted by the use of mixed gas plasma of, e.g., $C_4F_8$ and Ar.

Then, the etching stopper film 16 of SiN film is etched. For example, wet etching using a 150° C. aqueous solution of phosphoric acid is used. The etching with phosphoric acid can secure a selectivity of about 50 between the SiN film and the silicon oxide film, and substantially no erosion of the base insulation film 32 is found. Because etching with phosphoric acid is isotropic, the SiN film is etched horizontally as well. Thus the insulation film 18 is overhung, forming the cavity 30.

Then, the insulation film 32 of silicon oxide film is isotropically etched with mixed gas plasma of $CF_4$, $CHF_3$ and Ar. In this etching the upper insulation film 18 acts as the mask, and only the insulation film 32 directly below the opening in the overhung insulation film 18 is removed.

Figure 19C:
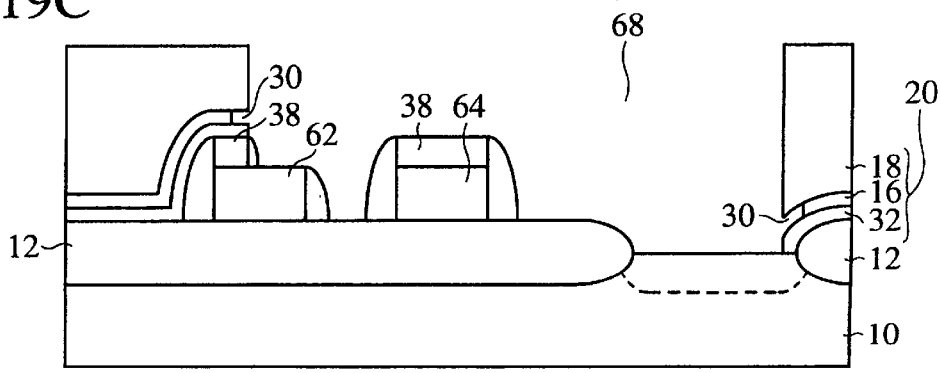

Thus the wiring groove 68 with a source/drain diffused layer 14 and the gate electrode 62 exposed therein is formed (FIG. 19C).

Figure 20A:
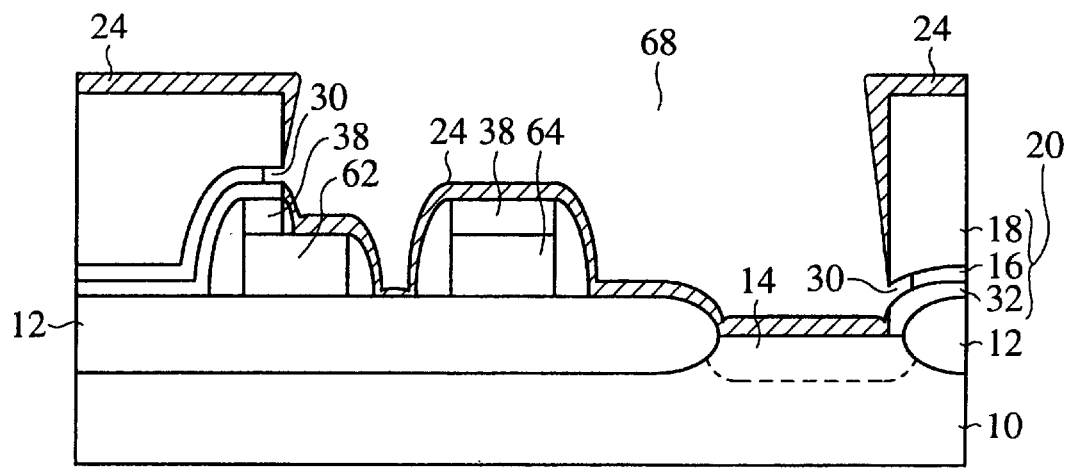
FIGS. 20A and 20B are sectional views of the semiconductor device according to the fifth embodiment of the present invention in the steps of the method for fabricating the same, which explain the method (Part 2).

Then the conducting film 24 of an approximately 70 nm-thick TiN film is deposited. At this time the TiN film is deposited on the bottom of the wiring grove 68 but is not deposited in the cavity 30. However, the insulation film 32 remains in the cavity 30, and the semiconductor substrate 10 is not exposed in the wiring groove 68 after the conducting film 24 is deposited. Accordingly in depositing the conducting film 24 in the presence of the overhang, the conducting film 24 can be deposited, covering the substrate 10, which allows the usual sputtering to be used (FIG. 20A).

Next, W film is deposited by CVD to bury the wiring groove 68 with the W. The W film is deposited, for example, at a 400° C. substrate temperature, a 80 Torr pressure, a 20 cc $WF_6$ flow rate and a 2000 cc $H_2$ flow rate.

Here $WF_6$ gas, which is very reactive with Si of the semiconductor substrate, is used in forming the W film, but the $WF_6$ gas does not contact with the semiconductor substrate 10 because the semiconductor substrate 10 is isolated from the wiring groove 68 by the conducting film 24. The erosion of the semiconductor substrate 10 can be prevented.

Figure 20B:
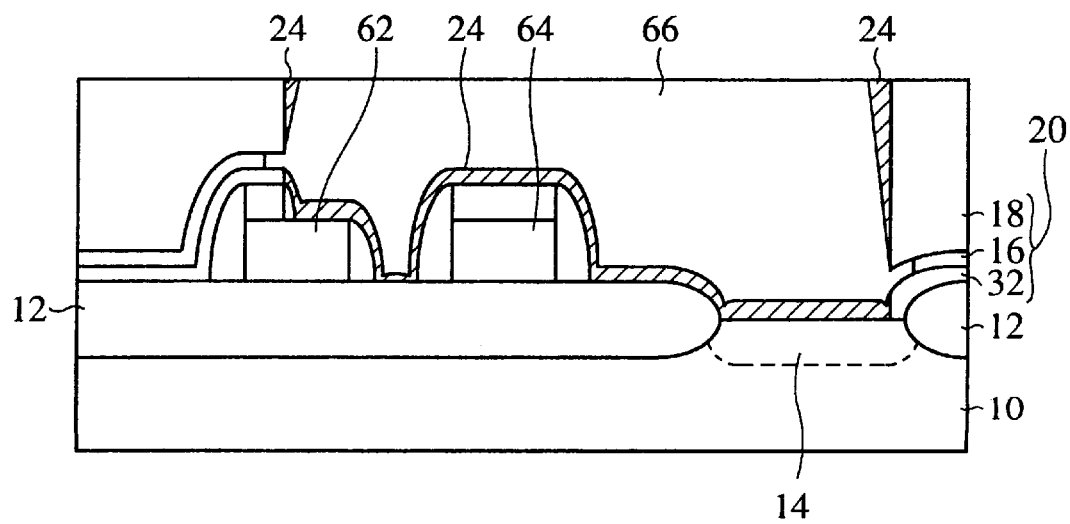

Subsequently the W film and the conducting film 24 on the inter-layer insulation film 20 are removed by CMP to leave the W only in the wiring groove 68. The CMP is conducted, for example, with an alumina-based abrasive agent, at a 50 rpm rotation number and at a 6 psi polishing pressure. Thus, the wiring 66 buried in the wiring groove 68 and interconnecting the source/drain diffused layer 14 and the gate electrode 62 is formed (FIG. 20B).

As described above, according to the present embodiment, because of the insulation film 32 formed below the etching stopper film 16, even when the insulation film 18 is overhung, the semiconductor substrate 10 on the bottom of the wiring groove 68 is completely covered by the conducting film 24, whereby reaction between a wiring material and the semiconductor substrate 10 can be prevented in forming the wiring 66.

In the present embodiment, W is buried as the buried wiring, but Cu may be buried to form the wiring 66 of Cu. In this case, it is more effective to suppress diffusion of Cu to form the conducting film 24 by the collimated sputtering used in the first embodiment or by the CVD used in the second embodiment.

Al may be used as the buried wiring. In this case as well, the reaction between the Al and the semiconductor substrate 10 can be effectively prevented.

The above-described processing conditions are one example, and suitable changes of the values do not affect the effects of the present invention.

A Sixth Embodiment

The semiconductor device according to a sixth embodiment of the present invention, and the method for fabricating the same will be explained with reference to FIGS. 21, 22A–22C, and 23A–23B.

Figure 21:
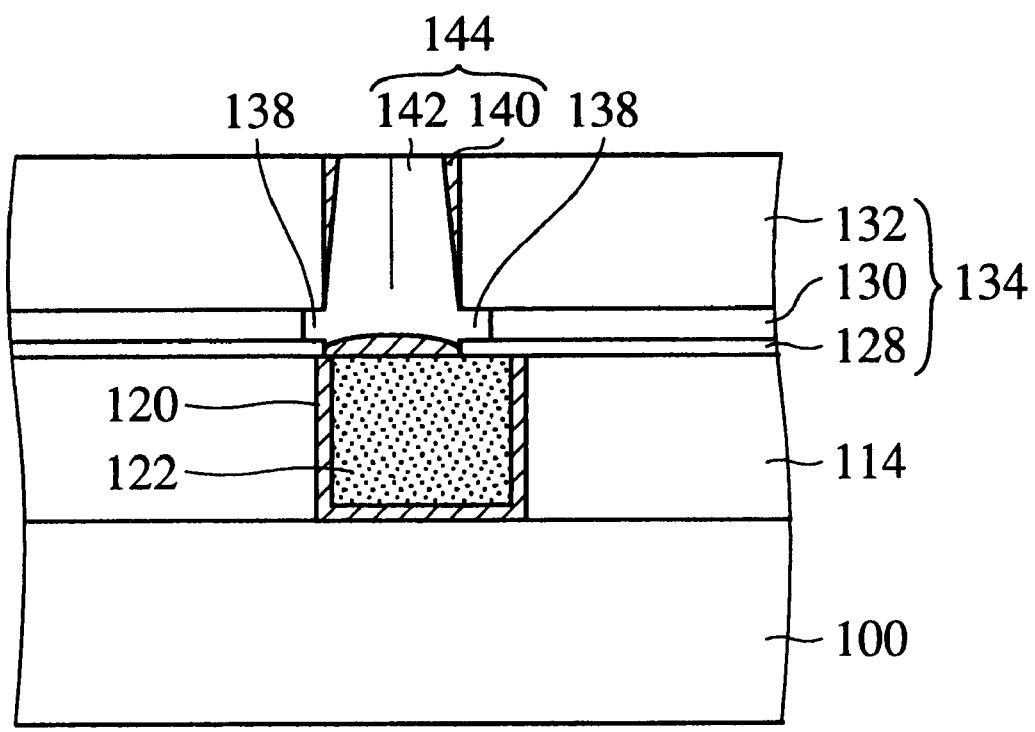
FIG. 21 is a schematic sectional view of the semiconductor device according to a sixth embodiment of the present invention.

FIG. 21 is a schematic sectional view of the semiconductor device according to the present embodiment, which shows a structure thereof. FIGS. 22A–22C and 23A–23B are sectional views of the semiconductor device according to the present embodiment at the steps of the method for fabricating the same, which explain the method.

Figure 36:
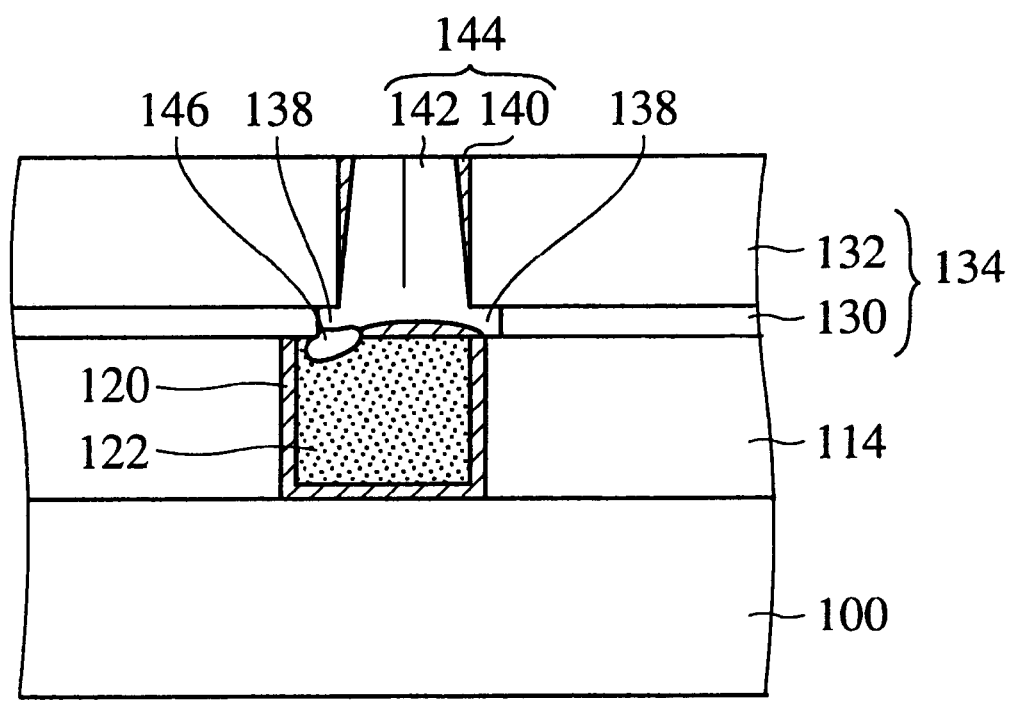
FIG. 36 is an explanatory view of disadvantages of a conventional semiconductor device (Part 5).

When a cavity 138 is formed below an inter-layer insulation film 134 in forming a via-hole on a buried wiring 122 as shown in FIG. 36, upon filling a plug in the via-hole, a raw material gas of the plug 142 and the buried wiring 122 react with each other in the cavity 138 to adversely generate a high-resistance reaction product 146, and contact characteristics are degraded.

The present embodiment provides the semiconductor device and the method for fabricating the same which can solve the above-described disadvantages.

The semiconductor device according to the present embodiment is characterized in that the inter-layer insulation film 134 formed on the buried wiring 122 has the same structure as the inter-layer insulation film of the fourth embodiment. That is, in the semiconductor device according to the present embodiment, an insulation film 128 is further formed below the etching stopper film 130 in the via-hole of the BLC structure, and the buried wiring 122 in the via-hole is spaced from the contact plug 144 by the insulation film 128 in the cavity 138.

Then, the method for fabricating the semiconductor device according to the present embodiment will be explained with reference to FIGS. 22A–22C and 23A–23B.

Figure 22A:
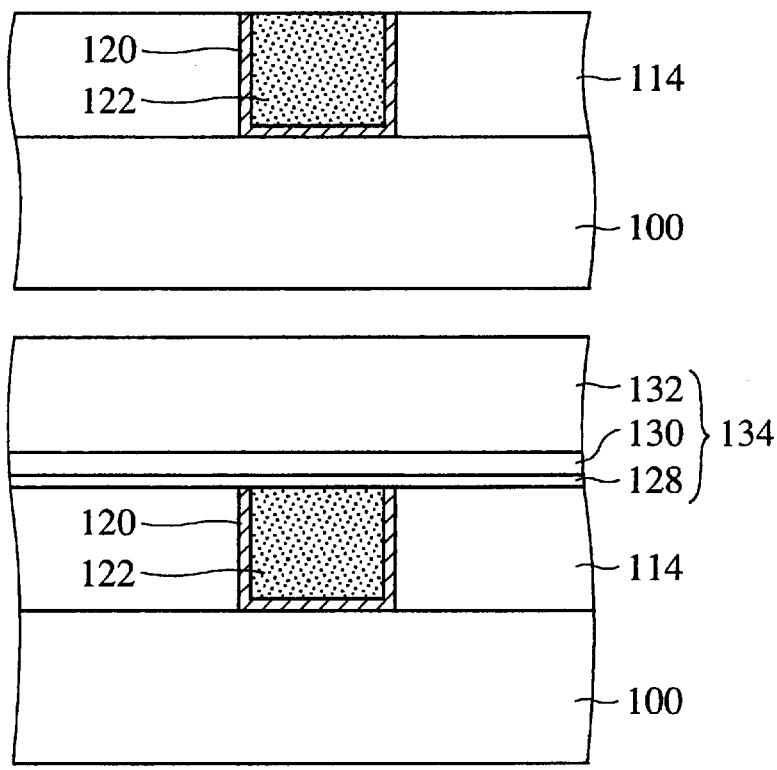
FIGS. 22A–22C are sectional views of the semiconductor device according to the sixth embodiment of the present invention in the steps of the method for fabricating the same, which explain the method (Part 1).

First, in the same way as in the method for fabricating the semiconductor device according to the third or the fifth embodiment, the buried wiring 122 in the inter-layer insulation film 114 is formed on the semiconductor substrate 100 (FIG. 22A).

Then, the insulation film 128 of an approximately 10 nm-thick silicon oxide film, the etching stopper film 130 of an approximately 50 nm-thick SiN film and the insulation film 132 of an approximately 700 nm-thick silicon oxide film are formed by PE-CVD on the base substrate with the wiring 122 thus buried in. The insulation film 128, the etching stopper film 130 and the insulation film 132 constitute the inter-layer insulation film 134.

Figure 22B:
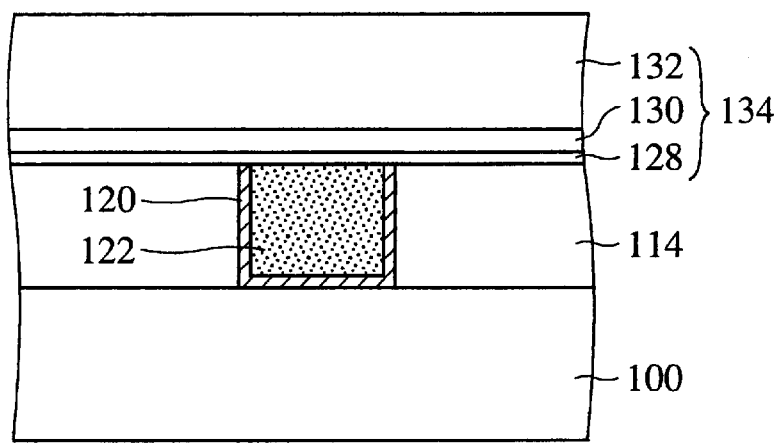

Subsequently the surface of the inter-layer insulation film 134 is polished to planarize the surface (FIG. 22B).

Then, the via-hole 136 formed on the wiring 122 is opened by the usual lithography and etching. The etching with $C_4F_8$ and Ar mixed gas plasma is first conducted to process the insulation film 132.

Then, the substrate is immersed in an aqueous solution of phosphoric acid of 150° C. to remove the etching stopper film 130 in the via-hole 136. The etching with phosphoric acid can secure selectivity of about 50 between the SiN film and the silicon oxide film, and accordingly substantially no erosion of the base insulation film 128 is found. The etching with phosphoric acid is anisotropic, and the SiN film is etched horizontally as well. This causes the insulation film 132 to overhang, forming the cavity 138.

Figure 22C:
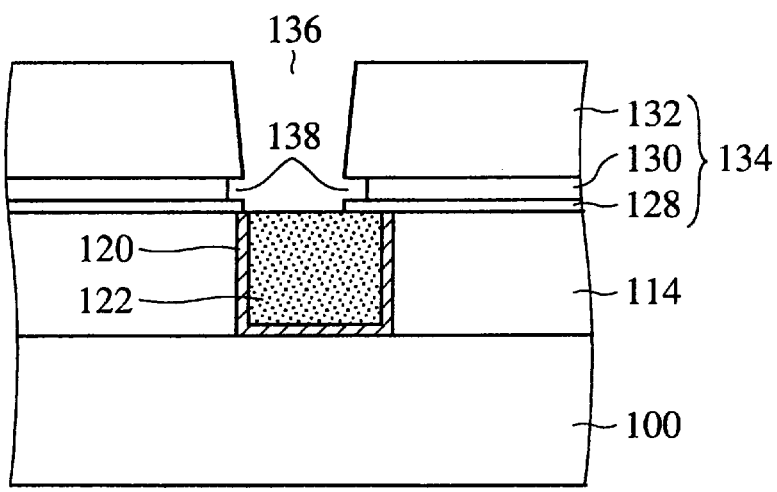

Subsequently the insulation film 128 of silicon oxide film is anisotropically etched by $CF_4$, $CHF_3$ and Ar mixed gas plasma. In the etching the upper insulation film 128 functions as the mask, and only the insulation film 128 directly below the opening of the overhung insulation film 132 is removed (FIG. 22C).

Figure 23A:
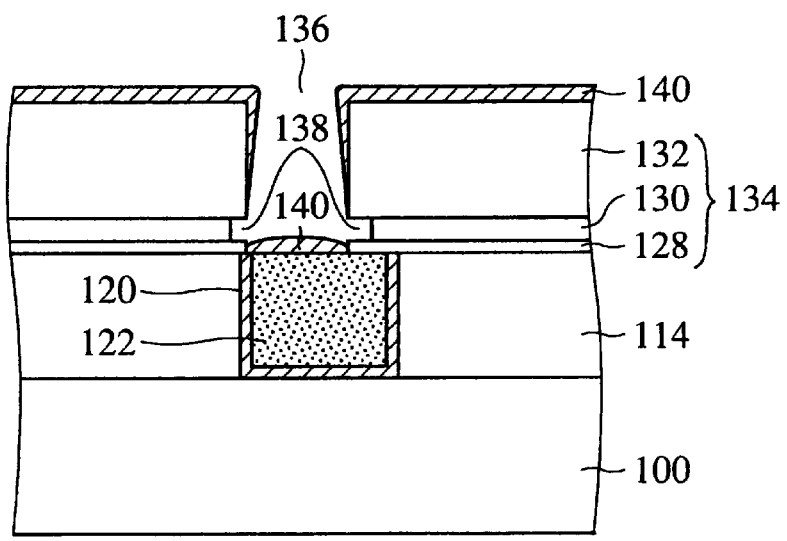
FIGS. 23A and 23B are sectional views of the semiconductor device according to the sixth embodiment of the present invention in the steps of the method for fabricating the same, which explain the method (Part 2).

Then, the conducting film 140 of an approximately 70 nm-thick TiN film is deposited by sputtering. At this time the conducting film 140 is deposited on the bottom of the via-hole but is not deposited in the cavity 134. However, because the insulation film 128 remains in the cavity 138, the wiring 122 is not exposed in the via-hole 136 after the conducting film 140 was deposited. Accordingly in depositing the conducting film 140 in the presence of the overhang, the conducting film 140 can be deposited, covering the wiring 122, which allows the usual sputtering to be used (FIG. 23A).

Then, an approximately 660 nm-thick W film is deposited by CVD. As described above, because the wiring 122 in the via-hole 136 is not exposed, $WF_6$ gas does not contact the wiring 122 when the W film is deposited. Accordingly it does not happen that the wiring of Cu reacts with the $WF_6$ gas to generate a high-resistance reaction product, and good contact characteristics between the wiring 122 and the W film can be maintained.

Figure 23B:
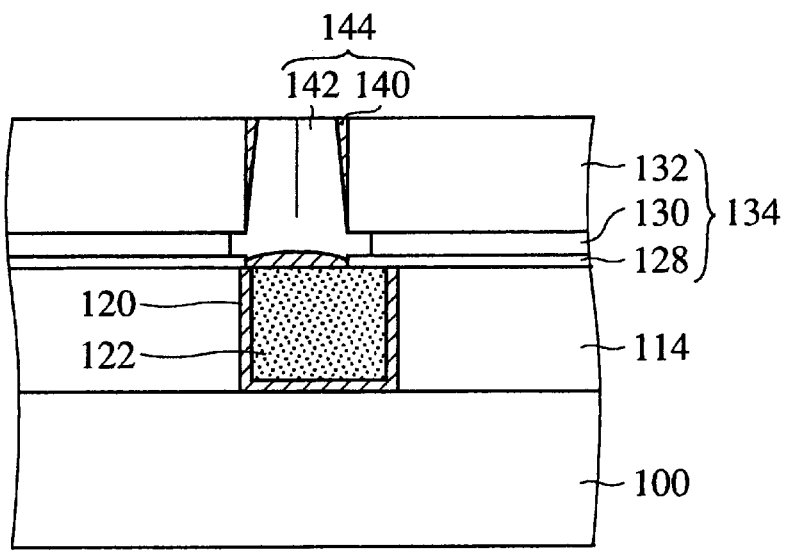

Subsequently, the W film is etched back to leave the W film only in the via-hole 136 to thereby form the contact plug 144 (FIG. 23B).

As described above, according to the present embodiment, the insulation film 128 is provided below the etching stopper film 130, whereby even when the insulation film 132 overhangs, the wiring 122 in the via-hole is completely covered by the conducting film 140, and a raw material gas of the plug 142 and the wiring 122 never react with each other when the plug 142 is formed. Contact reliability between the contact plug 144 and the wiring 122 can be improved.

The present invention is not limited to the present embodiment and covers various modifications.

In the present embodiment, for example, the contact plug 144 is formed on the buried wiring 122, but the present invention is applicable to a case in which the buried wiring is formed on the contact plug.

The present invention is to prohibit a conductive material exposed in the cavity 128 from reacting with a raw material gas for the CVD or a wiring material of the upper layer to thereby keep contact characteristics from the affection. The present invention is applicable to various materials and various wiring structures.

The present embodiment has solved the disadvantage by providing the insulation film 128 below the etching stopper film 120, but it is also possible that the structure of the semiconductor device of the first or the second embodiment is used to space the via-hole 136 from the cavity 138 by the conducting film 140 or completely fill the cavity 138 with the conducting film 140.

The above-described processing conditions are one example, and changes of the values do not affect the advantages of the present invention.

A Seventh Embodiment

The semiconductor device according to a seventh embodiment of the present invention and a method for fabricating the same will be explained with reference to FIGS. 24, 25A–25C, and 26A–26B.

Figure 24:
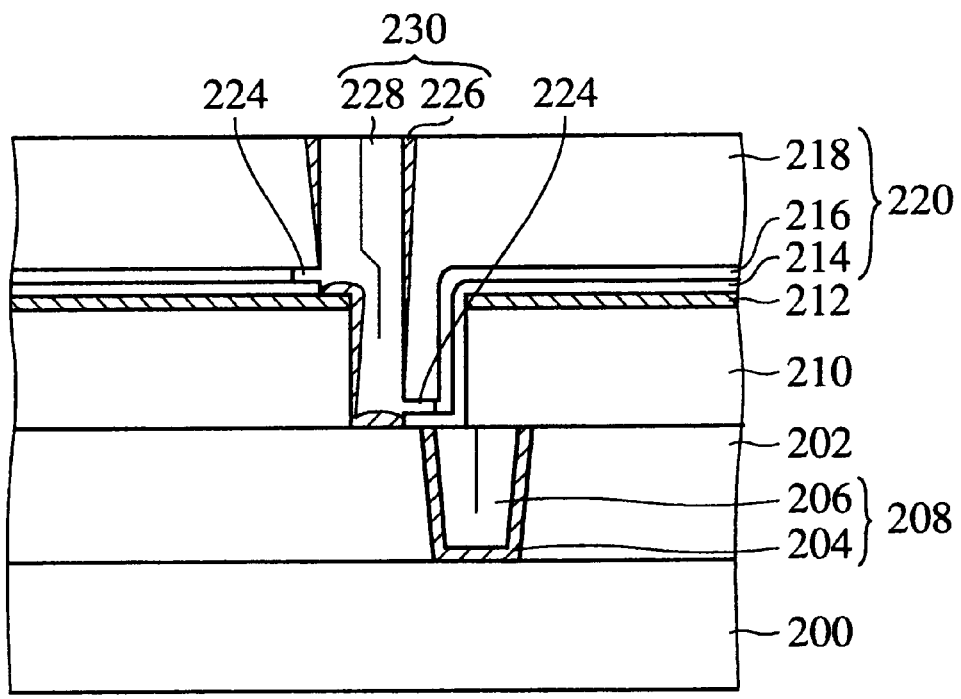
FIG. 24 is a schematic sectional view of the semiconductor device according to a seventh embodiment of the present invention, which explains a structure thereof.

FIG. 24 is a schematic sectional view of the semiconductor device according to the present embodiment. FIGS. 25A–25C and 26A–26B are sectional views of the semiconductor device according to the present embodiment at the steps of the method for fabricating the same, which explain the method.

Figure 34:
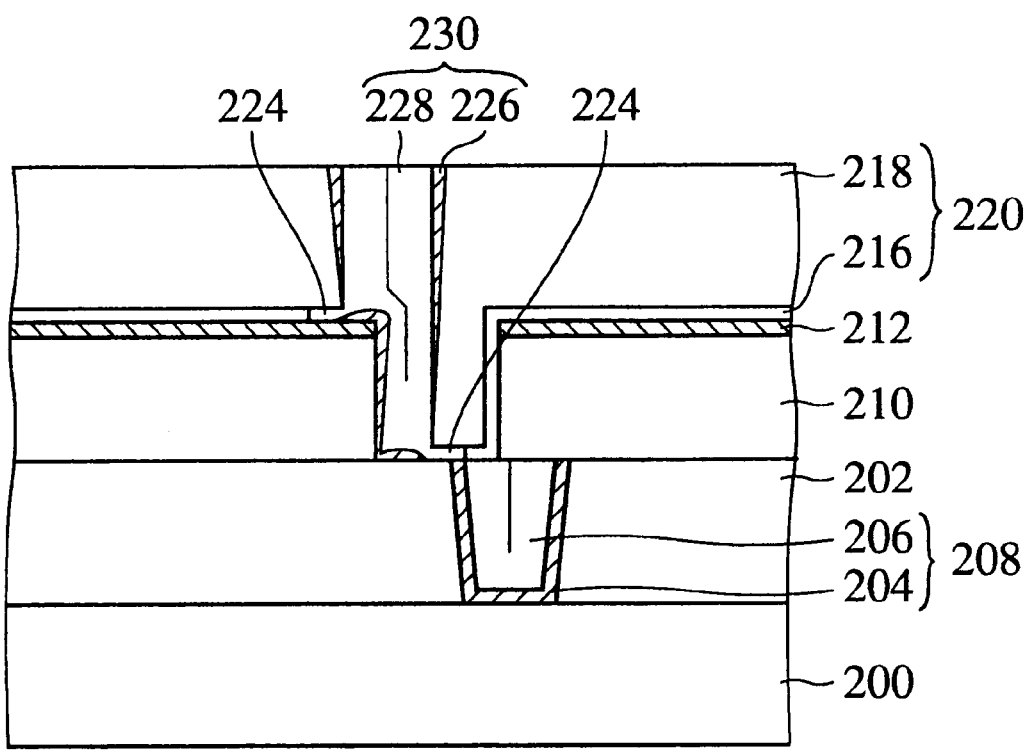
FIG. 34 is an explanatory view of disadvantages of a conventional semiconductor device (Part 3).

In the semiconductor device shown in FIG. 34 including the wiring 210 connected to the contact plug 208 buried in the inter-layer insulation film 202 on the semiconductor substrate 200, in a case that the BLC structure is used in opening a via-hole to be connected to the wiring 210, the contact plug 230 often short-circuits with the contact plug 208 in the cavity 224 formed when the etching stopper film 216 is etched.

The present embodiment provides a semiconductor device which can reduce such a short-circuit, and a method for fabricating the semiconductor device.

The semiconductor device according to the present embodiment is characterized in that an insulation film 214 is further provided below an etching stopper film 216. That is, an upper inter-layer insulation film 220 in which a contact plug 230 is to be buried is constituted by the insulation film 214, the etching stopper film 216 and an insulation film 218. The contact plug 230 filled in the via-hole is insulated from the contact plug 208 by the insulation film 214 in the cavity 224.

Then, the method for fabricating the semiconductor device according to the present embodiment will be explained with reference to FIGS. 25A–25C and 26A–26B.

First, in the same way, as in, the third embodiment, the inter-layer insulation film 202 with the contact plug 208 buried in is formed on the semiconductor substrate 200.

Figure 25A:
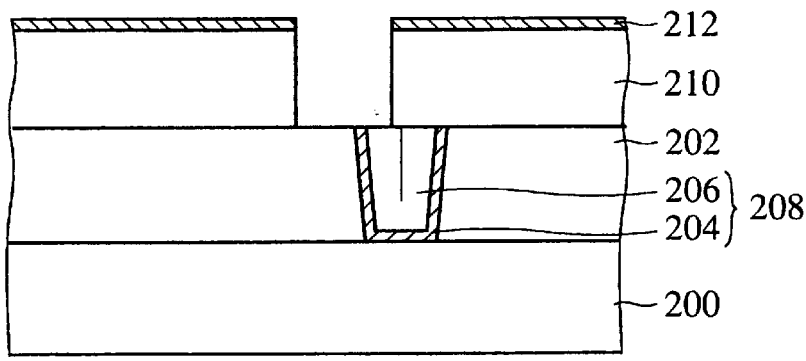
FIGS. 25A–25C are sectional views of the semiconductor device according to the seventh embodiment of the present invention in the steps of the method for fabricating the same, which explain the method (Part 1).

Then, a wiring layer constituted by wiring 210 of Al and the conducting film 212 of, e.g., TiN is formed on the inter-layer insulation film 202 with the contact plug 208 buried in (FIG. 25A). The conducting film 212 functions as an antihalation layer for patterning the wiring 210 and/or an electromigration preventive layer.

Subsequently the insulation film 214 of an approximately 10 nm-thick silicon oxide film and the etching stopper film 216 of an approximately 50 nm-thick SiN film and the insulation film 218 of an approximately 800 nm-thick silicon oxide film are deposited by PE-CVD on the base substrate with the thus formed wiring 210, and the inter-layer insulation film 220 constituted by the insulation film 214, the etching stopper film 216 and the insulation film 218 is formed.

Figure 25B:
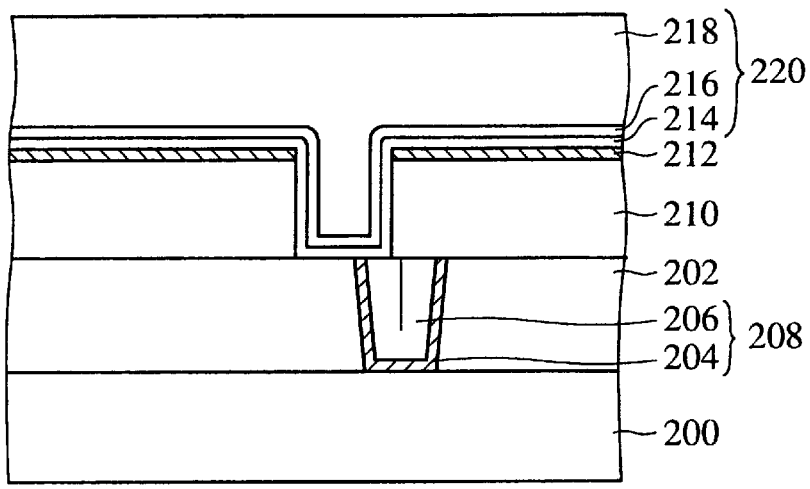

Then, the surface of the inter-layer insulation film 220 is polished by CMP to planarize the surface (FIG. 25B).

Then, the via-hole 222 formed on the wiring 210 is opened by the usual lithography and etching. The etching is first conducted with $CF_8$ and Ar mixed gas plasma to process the insulation film 218.

Subsequently the substrate is immersed in an aqueous solution of phosphoric acid of 150° C. to remove the etching stopper film 216 in the via-hole 222. The etching with phosphoric acid can secure a selectivity of about 50 between SiN film and silicon oxide film, and no substantial erosion of the base insulation film 214 is found. The etching with phosphoric acid is isotropic, and the SiN film is etched horizontally as well, whereby the insulation film 218 is overhung, forming the cavity 224.

Figure 25C:
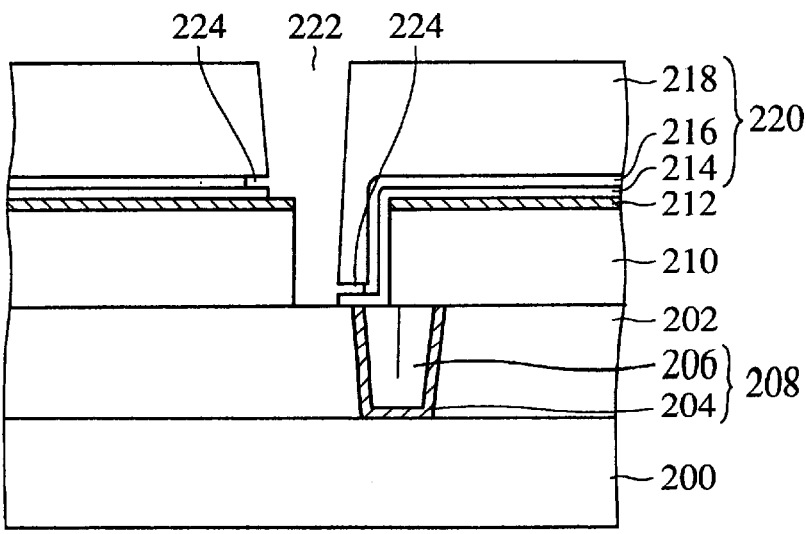

Then, the insulation film 214 of silicon oxide film is anisotropically etched by $CF_4$, $CHF_3$ and Ar mixed gas plasma. Because the upper insulation film 218 functions as the mask in the etching, only the insulation film directly below the opening of the overhung insulation film 218 is removed (FIG. 25C).

At this time, even in a case that the cavity 224 is extended over the contact plug 208, because of the insulation film 214 in the cavity 224, the contact plug 208 is never exposed in the via-hole 222.

Figure 26A:
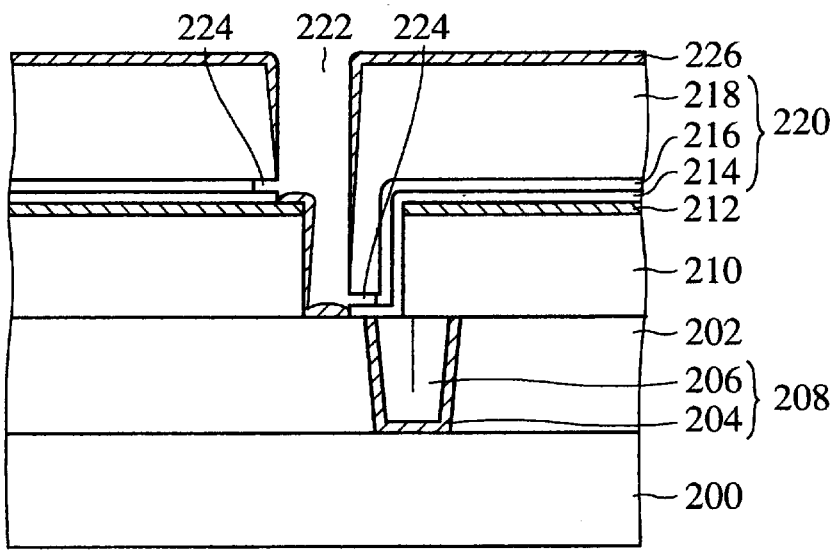
FIGS. 26A and 26B are sectional views of the semiconductor device according to the seventh embodiment of the present invention in the steps of the method for fabricating the same, which explain the method (Part 2).

Next, the conducting film 226 of an approximately 70 nm-thick TiN film is deposited by sputtering (FIG. 26A).

Subsequently an approximately 600 nm-thick W film is deposited by CVD. As described above, because the contact plug 208 is not exposed in the via-hole 222, the W film never short-circuits with the W film.

Figure 26B:
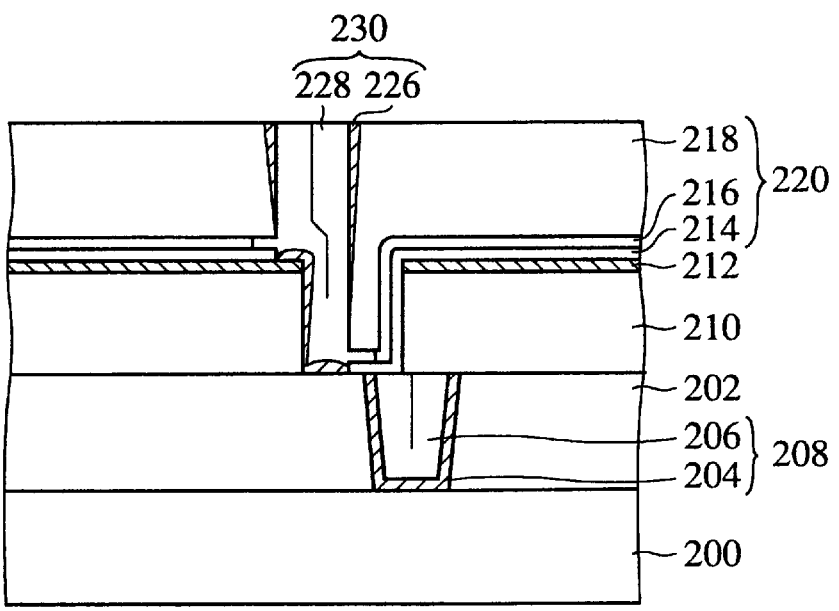

Then, the W film is etched back to leave the W film only in the via-hole 222 to form the contact plug 230 (FIG. 26B).

As described above, according to the present embodiment, the insulation film 214 is provided below the etching stopper film 216, whereby even in a case that the insulation film 218 overhangs, the contact plug 208 is not exposed in the cavity 224. In comparison with the conventional semiconductor device, short-circuit between the contact plug 230 and the contact plug 208 can be reduced.

The present invention is not limited to the present embodiment and cover various modification.

In the present embodiment, for example, the insulation film 214 is provided below the etching stopper film 216 to solve the disadvantage, but it is possible that the structure of the semiconductor device according to the first embodiment is used to completely space the via-hole 222 from the cavity 224 by the conducting film 226.

The above-described processing conditions are one example, and changes of the values do not affect the advantages of the present invention.

An Eighth Embodiment

A semiconductor device according to an eighth embodiment of the present invention, and a method for fabricating the same will be explained with reference to FIGS. 27, 28A–28C, and 29A–29B.

Figure 27:
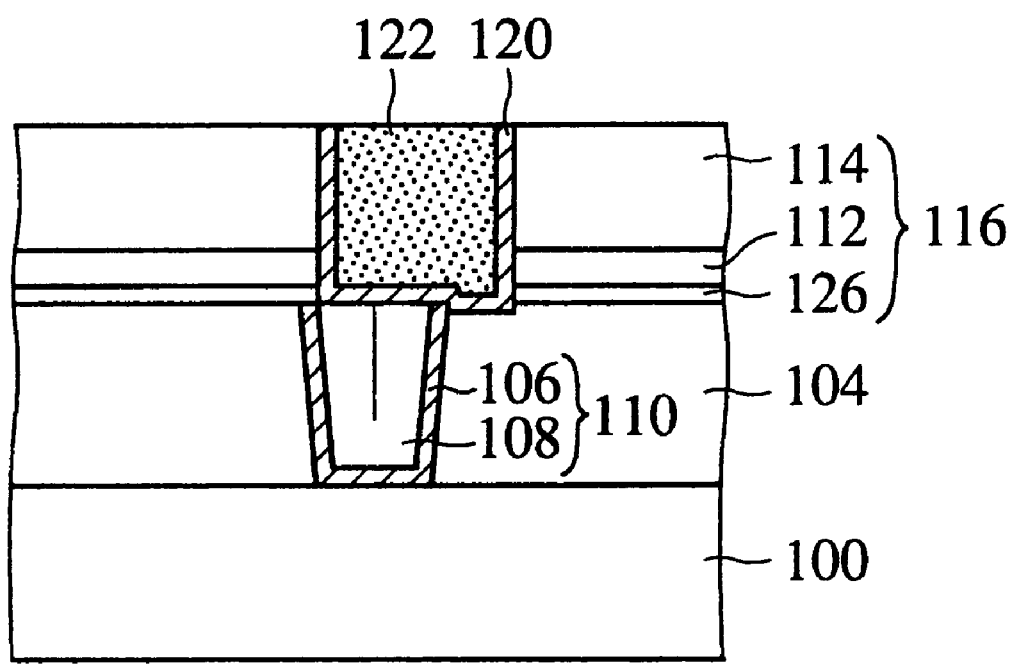
FIG. 27 is a schematic sectional view of the semiconductor device according to an eighth embodiment of the present invention, which explains a structure thereof.

FIG. 27 is a schematic sectional view of the semiconductor device according to the present embodiment, which shows a structure thereof. FIGS. 28A–28C and 29A–29B are sectional views of the semiconductor device according to the present embodiment at the steps for fabricating the same, which explain the method.

In the fourth to the seventh embodiments, the structure in which the insulation film is further provided below the etching stopper film is applied to the inter-layer insulation film, but the application of this structure to formation of the buried wiring on the inter-layer insulation film facilitates the etching for forming the wiring groove.

In the present embodiment, the structure of the inter-layer insulation film of the fourth embodiment is applied to the structure of the semiconductor device according to the third embodiment.

The semiconductor device according to the present embodiment is characterized in that the semiconductor device according to the third embodiment including an insulation film 126 of silicon oxide film is further provided below the etching stopper film 112.

Such provision of the insulation film 126 facilitates the etching step of forming a wiring groove 118 for wiring 122 to be buried in.

Next, the method for fabricating the semiconductor device according to the present embodiment will be explained.

Figure 28A:
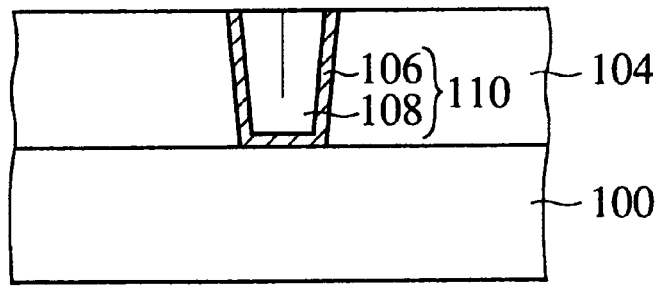
FIGS. 28A–28C are sectional views of the semiconductor device according to the eighth embodiment of the present invention in the steps of the method for fabricating the same, which explain the method (Part 1).

First, an inter-layer insulation film 104 with a contact plug 110 buried in is formed on a semiconductor substrate 100 in the same way as, e.g., in the third embodiment (FIG. 28A).

Then, the insulation film 126 of an approximately 10 nm-thick $SiO_2$ film, and the etching stopper film 112 of an approximately 50 nm-thick SiN film are deposited sequentially on the base substrate.

Figure 28B:
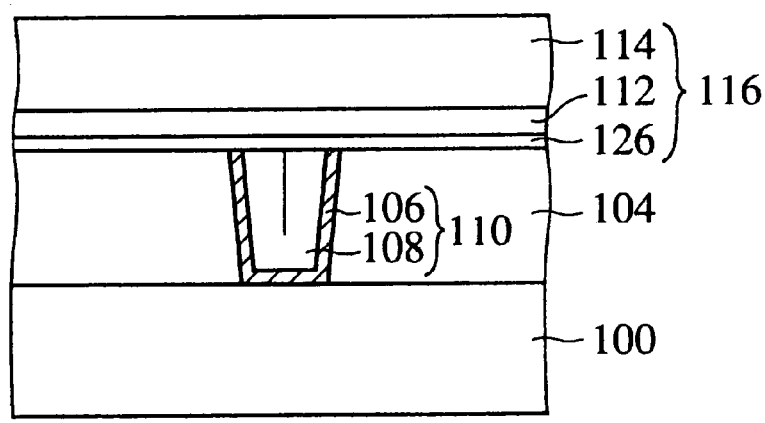

Subsequently the insulation film 114 of an approximately 250 nm-thick $SiO_2$ is deposited on the etching stopper film 112 to form the inter-layer insulation film 116 constituted by the insulation film 126, the etching stopper film 112 and the insulation film 114 (FIG. 28B).

The wiring groove 118 is opened by the usual lithography and anisotropic etching through the insulation film 114 down onto the etching stopper film 112. Etching conditions for this etching are so set that the etching stopper film 112 of SiN film as a sufficiently low etching speed than the insulation film 114 of $SiO_2$, whereby the wiring groove 118 can be opened down onto the etching stopper film 112 without substantially etching the etching stopper film 112. It is preferable that the etching of the insulation film 114 is reactive ion etching by, e.g., $C_4F_8$ and Ar mixed gas plasma and are conducted under conditions which ensure selectivity of above 20 with respect to the etching stopper film 112.

Figure 28C:
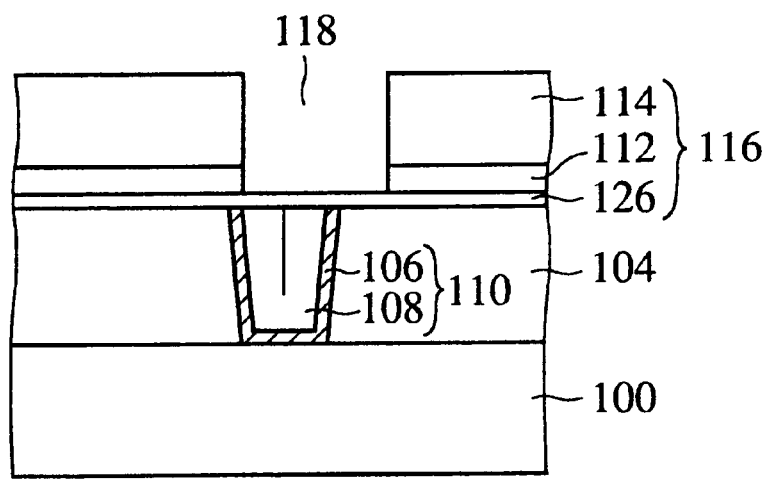

The etching of the insulation film 114 is followed by etching of the etching stopper film 112 down onto the insulation film 120. Etching conditions for this etching are so set that the insulation film 126 of $SiO_2$ has a sufficiently low etching speed with respect to the etching stopper film 112 of SiN film, whereby the wiring groove 118 can be opened down onto the insulation film 126 (FIG. 28C). It is preferable that the etching of the etching stopper film 112 is reactive ion etching by, e.g., $SF_6$ and $O_2$ mixed gas plasma and are conducted under conditions which ensure selectivity of above 3 with respect to the insulation film 126.

Figure 35A:
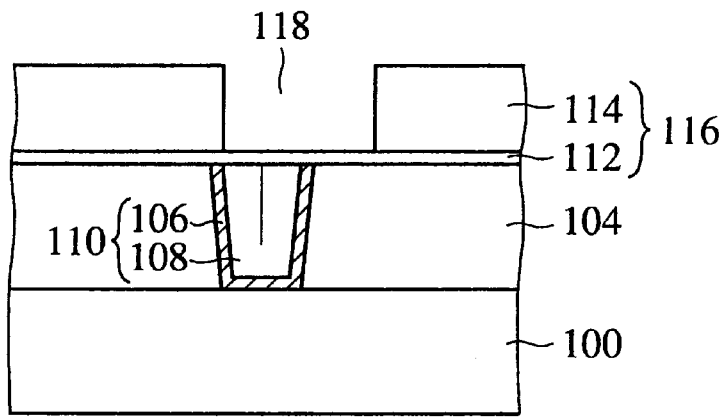
FIGS. 35A–35C are explanatory views of disadvantages of a conventional semiconductor device (Part 4).
Figure 35B:
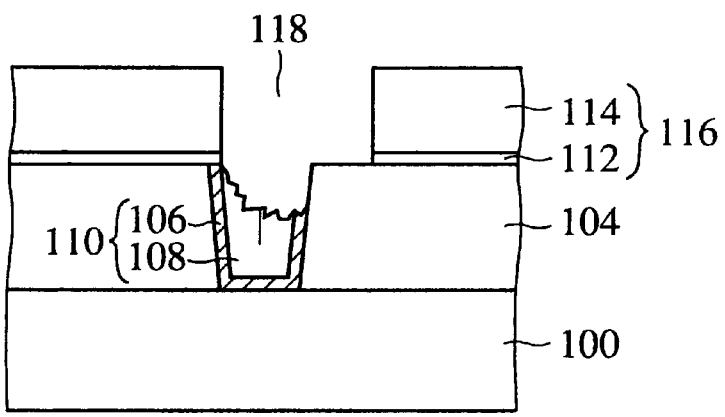
Figure 35C:
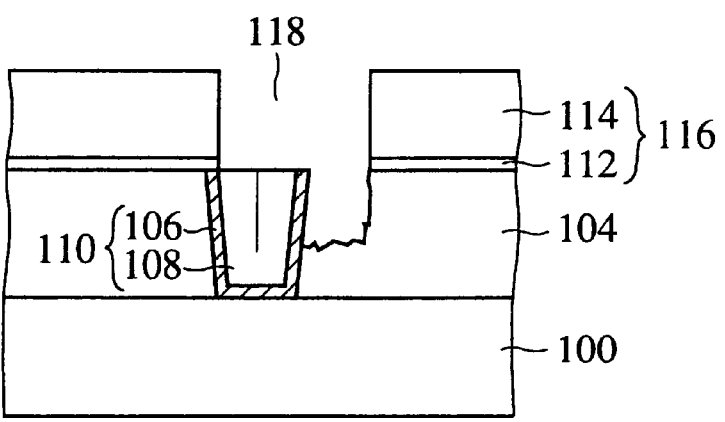

In the conventional structure of FIG. 35A, this etching exposes the base inter-layer insulation film 104 and the contact plug 110, which makes it necessary to set etching conditions by trading between the inter-layer insulation film 104 and the contact plug 110 their etching ratios with respect to the etching stopper film 112. However, in the present embodiment, a selectivity of the insulation film 126 alone with respect to the etching stopper film 112 must be considered, which facilitates the opening of he wiring groove 118.

Figure 29A:
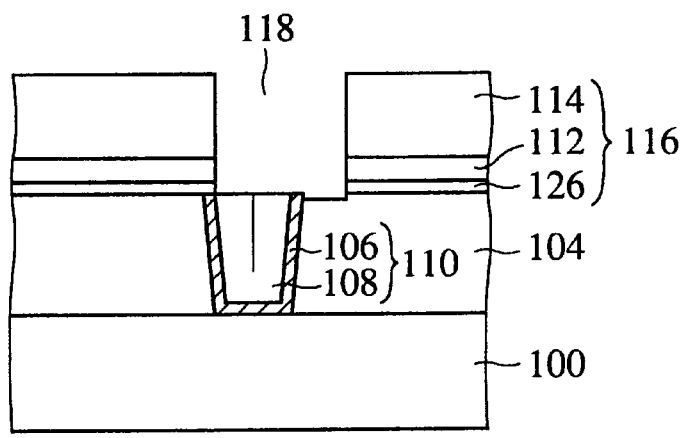
FIGS. 29A and 29B are sectional views of the semiconductor device according to the eighth embodiment of the present invention in the steps of the method for fabricating the same, which explain the method (Part 2).

Then, the insulation film 126 in the wiring groove 118 is etched to expose the contact plug 110 in the wiring groove 116. At this time, the inter-layer insulation film 104 is exposed in the wiring groove 118, and simultaneously with the etching of the insulation film 126, the inter-layer insulation film 104 is also etched. The thickness of the insulation film 126, however, is about 10 nm and is so thin that still in consideration of an overetching amount, the etching of the insulation film 126 causes a sufficiently small reduction of the thickness of the inter-layer insulation film 104. Accordingly, a step which affects contact characteristics never occurs in the wiring groove 18 (FIG. 29A).

The etching of the insulation film 126 has a sufficient selectivity with respect to the contact plug 110, and the contact plug 110 is never etched.

Subsequently, the conducting film 120 connected to the contact plug 110 is formed on the inside wall and the bottom of the wiring groove 118.

Then, Cu film is deposited by sputtering and reflowed to bury the Cu in the wiring groove 118. The sputtering is conducted, for example, at a 1.5 mTorr pressure, a 5 kW power and a 25 sccm Ar flow rate. The reflow is conducted, for example, at 350° C., at a 1000 sccm Ar flow rate and a 80 Torr pressure.

Figure 29B:
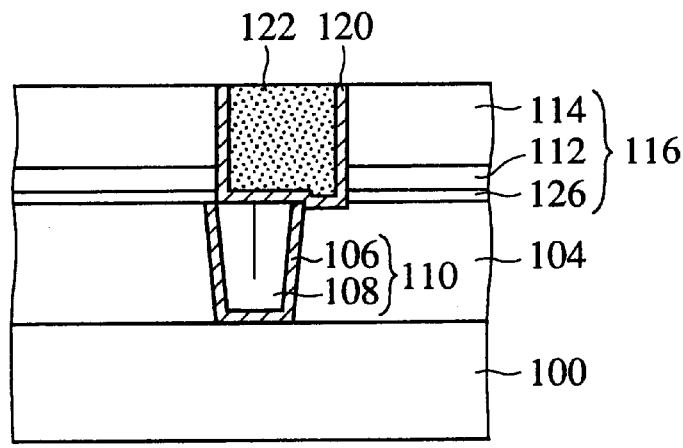
Figure 30A:
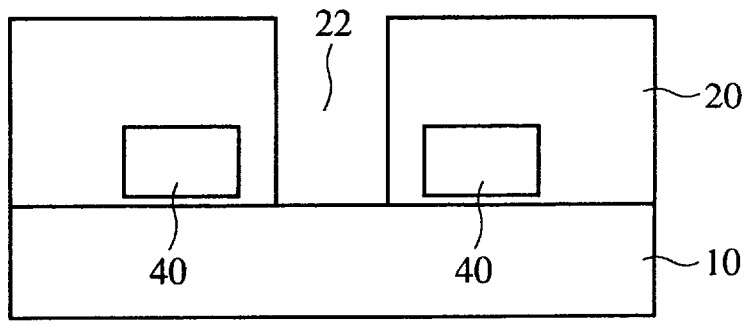
FIGS. 30A–30D are explanatory views of a conventional semiconductor device having a SAC structure.
Figure 30B:
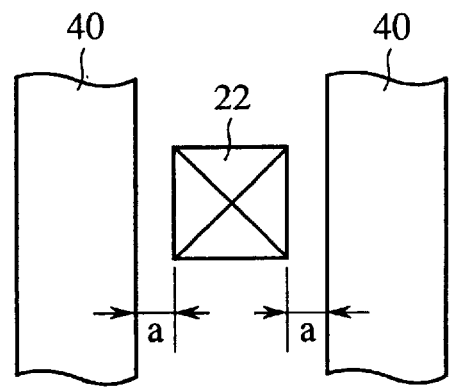
Figure 30C:
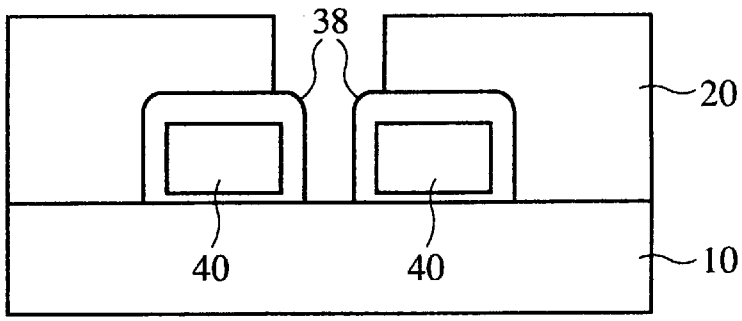
Figure 30D:
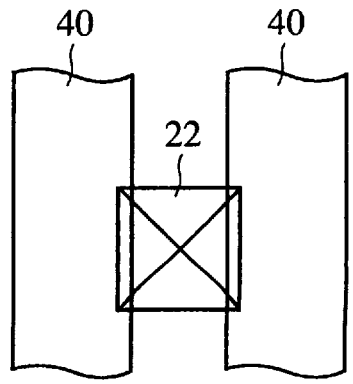
Figure 31A:
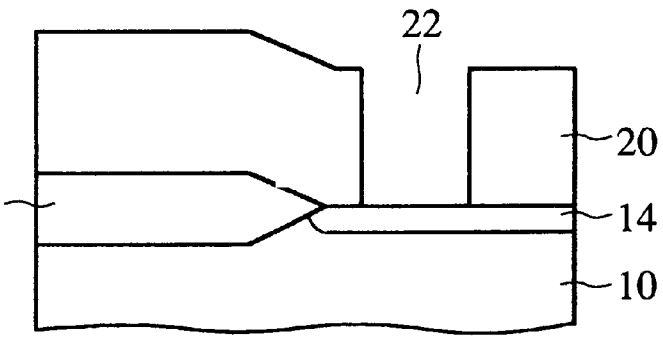
FIGS. 31A–31D are explanatory views of a conventional semiconductor device having a BLC structure.
Figure 31B:
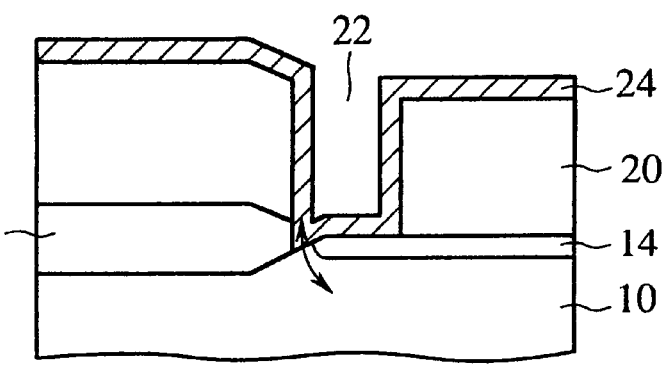
Figure 31C:
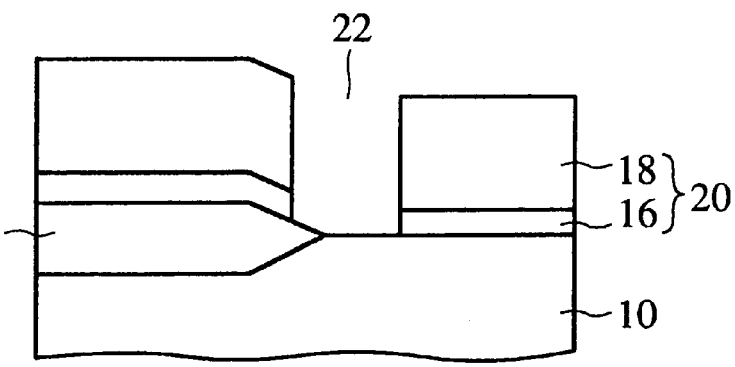
Figure 31D:
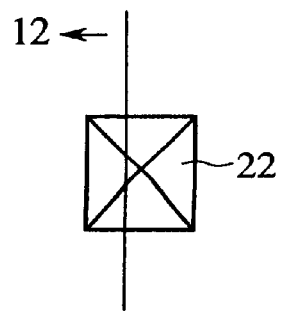
Figure 32A:
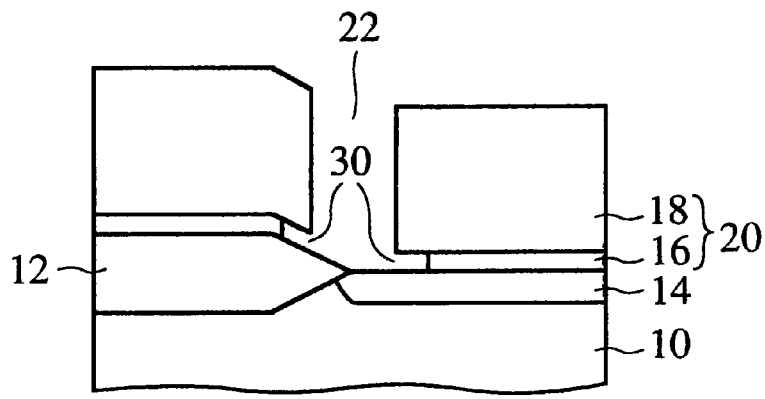
FIGS. 32A–32C are explanatory views of disadvantages of a conventional semiconductor device (Part 1).
Figure 32B:
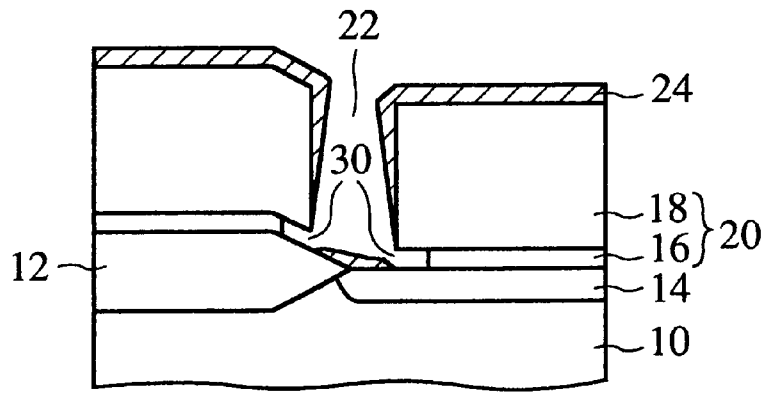
Figure 32C:
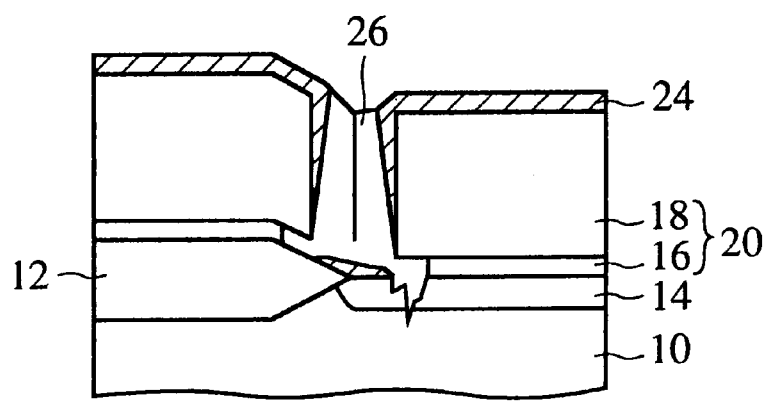
Figure 33A:
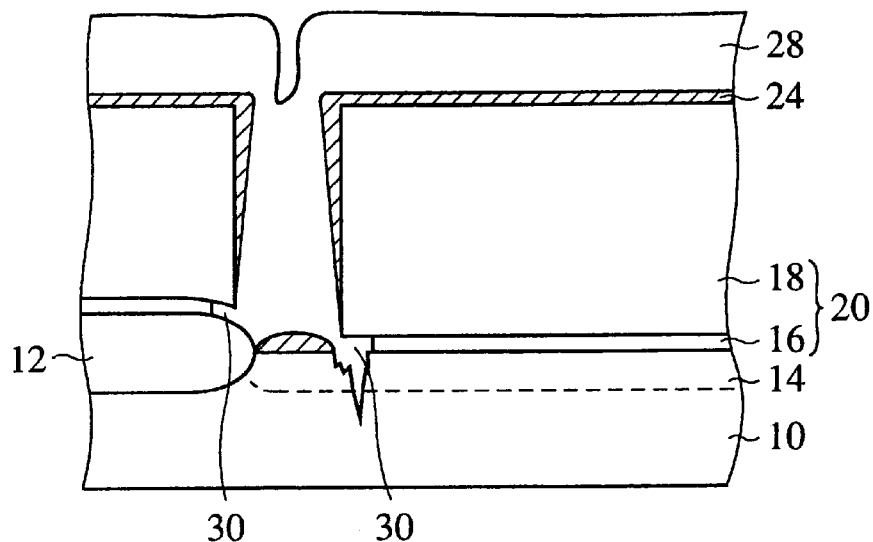
FIGS. 33A and 33B are explanatory views of disadvantages of a conventional semiconductor device (Part 2).
Figure 33B:
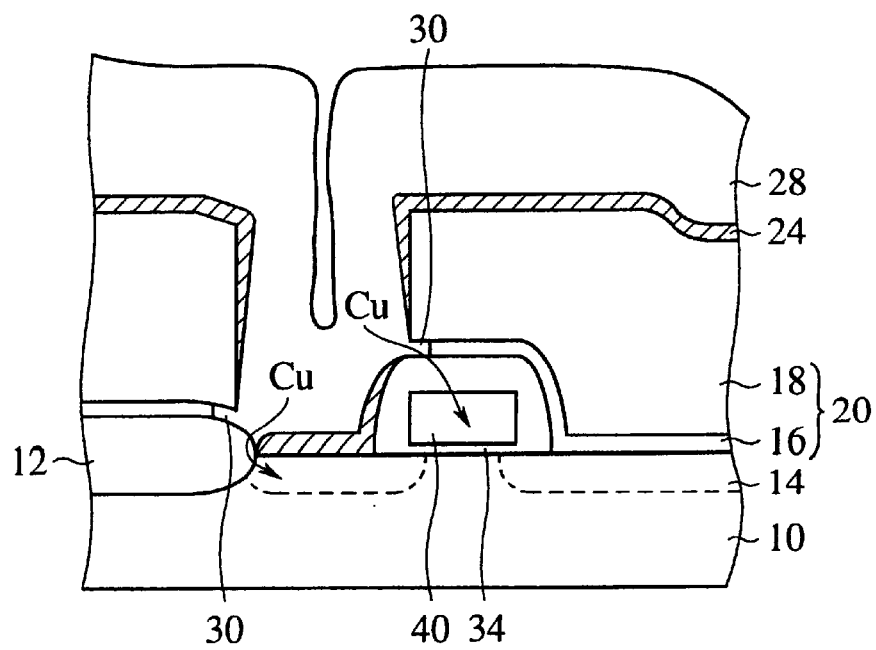

Then, the Cu on the inter-layer insulation film 116 is removed by CMP to leave the Cu only in the wiring groove 118. The CMP is conducted, for example, with an aluminum-based abrasive agent, at a 100 rpm rotation number, and at a 6 psi polishing pressure. The wiring 120 buried in the wring groove 116 is formed (FIG. 29B).

As described above, according to the present embodiment, in forming the buried wiring 120 in the inter-layer insulation film 116 on the inter-layer insulation film 104 with the contact plug 110 buried in, the BLC structure including the insulation film 126 further provided below the etching stopper film 112 is used, whereby the contact plug 110 and the inter-layer insulation film 104 are never etched when the etching stopper film 112 is etched. Thus contact characteristics of the contact between the contact plug 110 and the wiring 122 can be improved while the semiconductor device can have higher reliability.

The above-described processing conditions are one example, an changes of the values do not affect the advantages of the invention.

What is claimed is:

1. A semiconductor device comprising:

a base substrate;

an inter-layer insulation film including a first insulation film formed on the base substrate and a second insulation film formed on the first insulation film, the inter-layer insulation film having an opening which reaches the base substrate;

a conducting film formed on an inside wall and a bottom of the opening; and a buried conductor buried in the opening with the conducting film formed therein, a top level of the buried conductor being not higher than a top level of the conducting film;

a width of the opening in the first insulation film being larger than a width of the opening in the second insulation film, and the conducting film on the inside wall of the opening, and the conducting film on the bottom of the opening being uninterrupted at a boundary between the inside wall and the bottom of the opening.

2. A semiconductor device according to claim 1, wherein the conducting film is buried in the opening in the first insulation film below the second insulation film.

3. A semiconductor device according to claim 1, wherein the base substrate further comprises at least one wiring layer.

4. A semiconductor device according to claim 1, wherein, the buried conductor is a plug.

5. A semiconductor device according to claim 1, wherein, the buried conductor is a buried wiring.

6. A semiconductor device according to claim 1, wherein, the first insulation film has etching characteristics different from those of the second insulation film.

7. A semiconductor device according to claim 1, wherein, the first insulation film is formed of a silicon nitride film, and the second insulation film is formed of a silicon oxide film.

8. A semiconductor device according to claim 1, wherein the conducting film is not extended over the interlayer insulation film.

9. A semiconductor device according to claim 1, wherein the conducting film is not formed below the second insulation film.

10. A semiconductor device according to claim 2, wherein the base substrate further comprises at least one wiring layer.

11. A semiconductor device comprising:

a base substrate;

an inter-layer insulation film including a first insulation film formed on the base substrate, a second insulation film formed on the first insulation film and a third insulation film formed on the second insulation film, the inter-layer insulation film having an opening which reaches the base substrate;

a conducting film formed on an inside wall and a bottom of the opening; and a buried conductor buried in the opening with the conducting film formed therein;

a width of the bottom of the opening being substantially the same as a minimum width of the opening, a width of the opening in the second insulation film being larger than a width of the opening in the first insulation film and a width of the opening in the third insulation film, a portion of the base substrate on the bottom of the opening being covered by the conducting film.

12. A semiconductor device according to claim 11, wherein a width of the opening in the first insulation film is substantially the same as a width of the opening in the third insulation film.

13. A semiconductor device according to claim 11, wherein the base substrate further comprises at least one wiring layer.

14. A semiconductor device according to claim 11, wherein, the conducting film is not formed on the second insulation film in the opening, so that the conducting film on the inside wall of the opening and the conducting film on the bottom of the opening are interrupted.

15. A semiconductor device according to claim 11, wherein, the buried conductor is a plug.

16. A semiconductor device according to claim 11, wherein, the buried conductor is a buried wiring.

17. A semiconductor device according to claim 11, wherein, the second insulation film has etching characteristics different from those of the first insulation film and the third insulation film.

18. A semiconductor device according to claim 11, wherein, the first insulation film is formed of a silicon oxide film, the second insulation film is formed of a silicon nitride film, and the third insulation film is formed of a silicon oxide film.

19. A semiconductor device according to claim 12, wherein the base substrate further comprises at least one wiring layer.

* * * * *